United States Patent
Yoshida et al.

(10) Patent No.: US 11,404,292 B2
(45) Date of Patent: Aug. 2, 2022

(54) SUBSTRATE PROCESSING METHOD AND SUBSTRATE PROCESSING APPARATUS

(71) Applicant: SCREEN Holdings Co., Ltd., Kyoto (JP)

(72) Inventors: Yukifumi Yoshida, Kyoto (JP); Manabu Okutani, Kyoto (JP); Hiroshi Abe, Kyoto (JP); Shuichi Yasuda, Kyoto (JP); Yasunori Kanematsu, Kyoto (JP); Hitoshi Nakai, Kyoto (JP)

(73) Assignee: SCREEN Holdings Co., Ltd.

( * ) Notice: Subject to any disclaimer, the term of this patent is extended or adjusted under 35 U.S.C. 154(b) by 888 days.

(21) Appl. No.: 16/203,727

(22) Filed: Nov. 29, 2018

(65) Prior Publication Data
US 2019/0172733 A1 Jun. 6, 2019

(30) Foreign Application Priority Data
Dec. 5, 2017 (JP) .............................. JP2017-233600

(51) Int. Cl.
*H01L 21/02* (2006.01)
*H01L 21/67* (2006.01)
*H01L 21/687* (2006.01)
*H01L 21/677* (2006.01)

(52) U.S. Cl.
CPC .. *H01L 21/67051* (2013.01); *H01L 21/02052* (2013.01); *H01L 21/02057* (2013.01); *H01L 21/67103* (2013.01); *H01L 21/68714* (2013.01); *H01L 21/67742* (2013.01)

(58) Field of Classification Search
None
See application file for complete search history.

(56) References Cited

U.S. PATENT DOCUMENTS

| 2014/0041685 | A1 | 2/2014 | Kaneko et al. ................... 134/4 |
| 2014/0127908 | A1 | 5/2014 | Okutani ........................ 438/694 |
| 2015/0128994 | A1 | 5/2015 | Kaneko et al. |
| 2015/0279708 | A1 | 10/2015 | Kobayashi et al. |
| 2016/0035561 | A1 | 2/2016 | Aibara et al. |
| 2016/0035564 | A1 | 2/2016 | Aibara et al. |

(Continued)

FOREIGN PATENT DOCUMENTS

| JP | 2014-112652 A | 6/2014 |
| JP | 2014-197717 A | 10/2014 |

(Continued)

*Primary Examiner* — Mikhail Kornakov
*Assistant Examiner* — Ryan L Coleman
(74) *Attorney, Agent, or Firm* — Ostrolenk Faber LLP

(57) ABSTRACT

A substrate processing method includes a first processing liquid supplying step of supplying a first processing liquid to an upper surface of a substrate, a holding-layer forming step of solidifying or curing the first processing liquid to form a particle holding layer on the upper surface of the substrate, a holding-layer removing step of peeling and removing the particle holding layer from the upper surface of the substrate, a liquid film forming step of forming, after removal of the particle holding layer from the substrate, a liquid film of a second processing liquid, a gas phase layer forming step of forming a gas phase layer for holding the liquid film between the upper surface of the substrate and the liquid film, and a liquid film removing step of removing the second processing liquid from the upper surface of the substrate by moving the liquid film on the gas phase layer.

22 Claims, 12 Drawing Sheets

(56) References Cited

U.S. PATENT DOCUMENTS

2016/0214148 A1 7/2016 Okutani et al.
2018/0211828 A1 7/2018 Chung et al.

FOREIGN PATENT DOCUMENTS

| JP | 2015-119164 A | 6/2015 |
| JP | 2016-021597 A | 2/2016 |
| JP | 2016-136599 A | 7/2016 |
| KR | 10-2015-0111316 A | 10/2015 |
| WO | WO 2017/056746 A1 | 4/2017 |

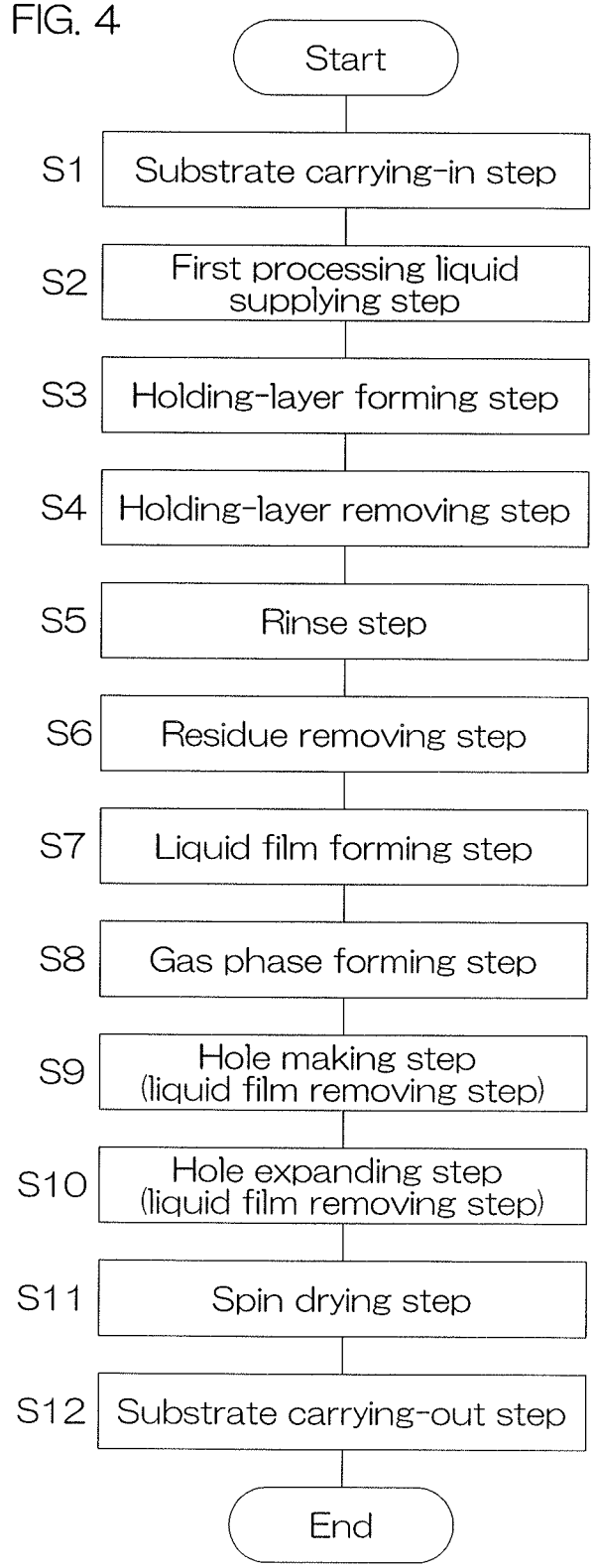

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2017-233600 filed on Dec. 5, 2017. The entire contents of this application are hereby incorporated herein by reference.

BACKGROUND OF THE INVENTION

1. Field of the Invention

The present invention relates to a substrate processing method and a substrate processing apparatus for processing substrates. Examples of substrates to be processed include substrates such as semiconductor wafers, substrates for liquid crystal displays, substrates for FPDs (Flat Panel Displays) such as organic ELs (Electroluminescence), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one at a time. In detail, a substrate is held substantially horizontally by a spin chuck. Then, after execution of a washing step of washing an upper surface of the substrate, a spin drying step is executed in which the substrate is rotated at a high speed for drying the upper surface of the substrate.

In the washing step, various types of contaminants adhered to a substrate, residues of a processing liquid, a resist, etc., used in prior steps or various types of particles (hereinafter, they may be generally referred to as "particles") are removed. Specifically, in the washing step, a washing liquid such as deionized water (DIW) is supplied to a substrate to remove particles physically or a chemical liquid which chemically reacts with particles is supplied to a substrate to remove the particles chemically.

However, since a pattern formed on a substrate has been made finer and more complicated, it is now more difficult to remove particles physically or chemically.

Thus, there has been proposed such a technique that a processing liquid which contains a solute and a volatile solvent is supplied to an upper surface of a substrate to form a film in which the processing liquid is solidified or hardened (hereinafter, referred to as "a particle holding layer") and, thereafter, the particle holding layer is removed (Japanese Patent Application Publication No. 2014-197717).

SUMMARY OF THE INVENTION

However, according to a method disclosed in Japanese Patent Application Publication No. 2014-197717, a dissolution processing liquid is supplied to an upper surface of a substrate, thereby dissolving a particle holding layer on the substrate. Therefore, particles may drop from the particle holding layer which is being dissolved and adhere again to the substrate and, thereby, a particle removal ratio is not made as high as expected.

Further, the dissolution processing liquid used for removing particles and a rinse liquid for washing away the dissolution processing liquid enter the inside of the pattern. Where the liquids which have entered the inside of the pattern are not sufficiently removed in the spin drying step, a surface tension will act on the pattern and the pattern may collapse by this surface tension.

In detail, a liquid surface (interface between air and liquid) of the rinse liquid which has entered the inside of a pattern is formed inside the pattern. Therefore, a surface tension of the liquid acts on a position at which the liquid surface is in contact with the pattern. Where the surface tension is large, the pattern may easily collapse. Since water that is a typical rinse liquid is large in surface tension, collapse of the pattern cannot be ignored in the spin drying step.

Thus, there has been proposed a method for using isopropyl alcohol (IPA) which is a low surface-tension liquid lower in surface tension than water (refer to, for example, Japanese Patent Application Publication No. 2016-21597). Specifically, IPA is supplied to an upper surface of a substrate to replace water which has entered the inside of a pattern by IPA and then the upper surface of the substrate is dried by removing IPA. However, where water that has entered the inside of the pattern is replaced by IPA and a surface tension of IPA acts on the pattern for a longer time or where the pattern is low in strength, the pattern may collapse.

Thus, one object of the present invention is to provide a substrate processing method and a substrate processing apparatus with which particles can be satisfactorily removed from an upper surface of a substrate and the upper surface of the substrate can be satisfactorily dried.

A preferred embodiment of the present invention provides a substrate processing method which includes a substrate holding step which holds a substrate horizontally, a first processing liquid supplying step which supplies a first processing liquid that contains a solute and a volatile solvent to an upper surface of the substrate, a holding-layer forming step in which the substrate is heated to volatilize at least partially the solvent from the first processing liquid supplied to the upper surface of the substrate and, thereby, the first processing liquid is solidified or hardened to form a particle holding layer on the upper surface of the substrate, a holding-layer removing step in which a peeling liquid, which peels the particle holding layer, is supplied to the upper surface of the substrate, thereby peeling and removing the particle holding layer from the upper surface of the substrate, a liquid film forming step in which, after removal of the particle holding layer from the substrate, a second processing liquid is supplied to the upper surface of the substrate, thereby forming a liquid film of the second processing liquid which covers the upper surface of the substrate, a gas phase layer forming step in which the substrate is heated to evaporate the second processing liquid in contact with the upper surface of the substrate, thereby forming a gas phase layer which holds the liquid film between the upper surface of the substrate and the liquid film, and a liquid film removing step in which the liquid film is moved on the gas phase layer to remove the second processing liquid which constitutes the liquid film from the upper surface of the substrate.

According to the above-described method, in the holding-layer forming step, the first processing liquid is solidified or hardened and, thereby, a particle holding layer is formed on the upper surface of the substrate. When the first processing liquid is solidified or hardened, particles are separated from the substrate. The thus separated particles are held in the particle holding layer. Therefore, in the holding-layer removing step, the peeling liquid is supplied to the upper surface of the substrate, thus making it possible to peel and remove the particle holding layer in a state of keeping the particles from the upper surface of the substrate.

Further, according to the method, in the liquid film forming step, there is formed a liquid film of the second processing liquid which covers the upper surface of the substrate. Then, in the gas phase layer forming step, the substrate is heated to form a gas phase layer which is composed of a gas resulting from evaporation of the second processing liquid between the liquid film and the upper surface of the substrate. On the gas phase layer, a liquid film of the second processing liquid is held. In this state, the liquid film of the second processing liquid is removed, thus making it possible to suppress or prevent collapse of a pattern on the upper surface of the substrate due to a surface tension of the second processing liquid. It is preferable that the gas phase layer is formed such that an interface with the second processing liquid will be positioned outside a pattern on the upper surface of the substrate. Thereby, it is possible to avoid a surface tension of the second processing liquid which acts on the pattern on the upper surface of the substrate and remove the liquid film of the second processing liquid outside the substrate in a state that no surface tension will act thereon.

As described so far, it is possible to satisfactorily remove particles from the upper surface of the substrate and satisfactorily dry the upper surface of the substrate.

In a preferred embodiment of the present invention, the substrate processing method further includes a heating step of heating the substrate by using a heater unit which faces a lower surface of the substrate. Furthermore, the heating step includes a first heating step of heating the substrate by using the heater unit for volatilizing at least partially the solvent in the holding-layer forming step and a second heating step of heating the substrate by using the heater unit for forming the gas phase layer in the gas phase layer forming step.

According to the above-described method, the common heater unit may be used in the holding-layer forming step and in the gas phase layer forming step. Therefore, it is not necessary to provide a plurality of units for heating the substrate.

In a preferred embodiment of the present invention, in the heating step, the heater unit is constant in temperature. Furthermore, the substrate processing method further includes a distance changing step which changes a distance between the lower surface of the substrate and the heater unit during execution of the heating step.

Time necessary for changing a temperature of the heater unit is longer than time necessary for changing a temperature of a substrate. Therefore, in the heating step, where the heater unit is changed in temperature to heat the substrate, it is necessary to wait until the heater unit is changed to a desired temperature in order that the substrate reaches a desired temperature. Therefore, the time necessary for substrate processing may take longer than necessary.

An amount of heat transmitted from the heater unit to a substrate is varied depending on a distance between a lower surface of a substrate and the heater unit. Thus, by changing a distance between the lower surface of the substrate and the heater unit in a state that the heater unit is kept constant in temperature, the temperature of the substrate can be changed to a desired temperature. Therefore, it is possible to save time necessary for changing a temperature of the heater unit. It is also possible to save time necessary for substrate processing.

The shorter the distance between a lower surface of a substrate and the heater unit, the larger the amount of heat transmitted to the substrate, and the substrate is elevated in temperature to a greater extent. For example, in the first heating step, a distance between the lower surface of the substrate and the heater unit is changed so as to give a positional relationship that the lower surface of the substrate is separated from the heater unit, and in the second heating step, a distance between the lower surface of the substrate and the heater unit is changed so as to give a positional relationship that the lower surface of the substrate is in contact with the heater unit. Thereby, a temperature of the substrate in the second heating step can be set higher than a temperature of the substrate in the first heating step.

In a preferred embodiment of the present invention, the distance changing step further includes a step of changing a distance between the lower surface of the substrate and the heater unit in the first heating step, depending on a film thickness of the particle holding layer formed in the holding-layer forming step.

In the first heating step, the solvent is volatilized by heating and, thereby, the particle holding layer undergoes shrinkage. In order to satisfactorily remove particles from a substrate, in the first heating step, it is preferable that the particle holding layer is allowed to shrink at a desired shrinkage ratio. The shrinkage ratio of the particle holding layer is a ratio of thickness of the particle holding layer after the first heating step in relation to thickness of the first processing liquid on a substrate immediately before the first heating step. A heating temperature necessary for allowing the particle holding layer to shrink at a desired shrinkage ratio is varied depending on a film thickness of the particle holding layer. Thus, a distance between a lower surface of a substrate and the heater unit is changed depending on the film thickness of the particle holding layer which is expected to be formed in the holding-layer forming step, thus making it possible to adjust the heating temperature to a temperature according to the film thickness of the particle holding layer. Thereby, the particle holding layer is allowed to shrink at a desired shrinkage ratio, irrespective of the film thickness of the particle holding layer. As a result, it is possible to satisfactorily remove particles.

In a preferred embodiment of the present invention, a solute composition which is the solute contained in the first processing liquid has a property that is insoluble in the peeling liquid before being heated at a temperature equal to or higher than a quality-changing temperature and also changed in quality by being heated at a temperature equal to or higher than the quality-changing temperature and becomes soluble in the peeling liquid. Furthermore, in the holding-layer forming step, the substrate is heated such that a temperature of the first processing liquid supplied to the upper surface of the substrate becomes a temperature lower than the quality-changing temperature.

According to the above-described method, in the holding-layer forming step, the particle holding layer is formed by heating the substrate such that a temperature of the first processing liquid becomes a temperature lower than the quality-changing temperature. Therefore, although the particle holding layer is hardly soluble or insoluble in the peeling liquid, it can be peeled by the peeling liquid. Consequently, in the holding-layer removing step, the particle holding layer in a state of holding particles can be peeled and removed from the upper surface of the substrate without dissolving the particle holding layer formed on the upper surface of the substrate by using the peeling liquid.

As a result, the particle holding layer in a state of holding particles can be peeled from the upper surface of the substrate to remove the particles at a high removal ratio. It is also possible to suppress residues of the particle holding layer from remaining on the upper surface of the substrate or adhering again thereto.

In a preferred embodiment of the present invention, in the holding-layer forming step, the substrate is heated such that a temperature of the first processing liquid supplied to the upper surface of the substrate will be lower than a boiling point of the solvent.

According to the above-described method, a solvent is allowed to remain in the particle holding layer after heating in the holding-layer forming step. Therefore, in the subsequent holding-layer removing step, the solvent remaining in the particle holding layer interacts with the supplied peeling liquid, by which the particle holding layer can be easily peeled from the upper surface of the substrate. That is, the peeling liquid is allowed to permeate into the particle holding layer and reach an interface with the substrate, and, thereby, the particle holding layer can be floated and peeled from the upper surface of the substrate.

In a preferred embodiment of the present invention, the peeling liquid may be compatible with the solvent. In the holding-layer forming step, if a solvent is appropriately allowed to remain in the particle holding layer, the peeling liquid which is compatible with the solvent permeates into the particle holding layer and can reach the interface with the substrate. Thereby, the particle holding layer can be floated and peeled from the upper surface of the substrate.

In a preferred embodiment of the present invention, the substrate processing method further includes a residue removing step in which, after the holding-layer removing step and also before the liquid film forming step, a residue removing liquid which has a property that dissolves a solute composition of the solute contained in the particle holding layer is supplied to the upper surface of the substrate to remove residues remaining on the upper surface of the substrate after removal of the particle holding layer.

According to the above-described method, the residue removing liquid has a property that dissolves a solute composition which forms the particle holding layer. Therefore, residues of the particle holding layer can be dissolved in the residue removing liquid and removed from the upper surface of the substrate.

In a preferred embodiment of the present invention, the residue removing liquid is a liquid of the same type with the second processing liquid. Therefore, in the liquid film forming step, it is possible to save time for replacing the residue processing liquid on an upper surface of a substrate by the second processing liquid. It is, therefore, possible to shorten the time necessary for substrate processing.

In a preferred embodiment of the present invention, the liquid film removing step includes a hole making step in which, after formation of the gas phase layer, a gas is sprayed onto the liquid film on the substrate to partially remove the second processing liquid, thereby making a hole in the liquid film at a central region of the liquid film and a hole expanding step in which the hole is expanded to an outer periphery of the substrate and the liquid film is moved on the gas phase layer, thereby removing the second processing liquid which constitutes the liquid film outside the substrate.

According to the above-described method, the hole formed in the central region of the liquid film is expanded to an outer periphery of the substrate, thereby removing the liquid film from the substrate. Therefore, it is possible to suppress or prevent droplets of the second processing liquid from remaining on the substrate. It is, thereby, possible to satisfactorily dry the upper surface of the substrate.

A preferred embodiment of the present invention provides a substrate processing apparatus which includes a substrate holding unit which holds a substrate horizontally, a first processing liquid supplying unit which supplies, to an upper surface of the substrate, a first processing liquid which contains a solute and a volatile solvent, that is, the first processing liquid which is solidified or hardened by volatilizing at least partially the solvent to form a particle holding layer on the upper surface of the substrate, a heater unit which faces a lower surface of the substrate and heats the substrate, a peeling liquid supplying unit which supplies a peeling liquid, which peels the particle holding layer, to the upper surface of the substrate, a second processing liquid supplying unit which supplies a second processing liquid to the upper surface of the substrate, and a controller which controls the first processing liquid supplying unit, the heater unit, the peeling liquid supplying unit and the second processing liquid supplying unit.

Then, the controller is programmed so as to execute a first processing liquid supplying step of supplying the first processing liquid from the first processing liquid supplying unit to the upper surface of the substrate which is held horizontally, a holding-layer forming step in which the substrate is heated by the heater unit to volatilize at least partially the solvent from the first processing liquid supplied to the upper surface of the substrate, thereby the first processing liquid is solidified or hardened to form the particle holding layer on the upper surface of the substrate, a holding-layer removing step in which the peeling liquid is supplied from the peeling liquid supplying unit to the upper surface of the substrate, thereby peeling and removing the particle holding layer from the upper surface of the substrate, a liquid film forming step in which, after removal of the particle holding layer from the substrate, the second processing liquid is supplied from the second processing liquid supplying unit to the upper surface of the substrate, thereby forming a liquid film of the second processing liquid which covers the upper surface of the substrate, a gas phase layer forming step in which the substrate is heated by the heater unit to evaporate the second processing liquid in contact with the upper surface of the substrate, thereby forming a gas phase layer which holds the liquid film between the upper surface of the substrate and the liquid film, and a liquid film removing step in which the liquid film is moved on the gas phase layer to remove the second processing liquid which constitutes the liquid film from the upper surface of the substrate.

According to the above-described configuration, in the holding-layer forming step, the first processing liquid is solidified or hardened to form the particle holding layer on the upper surface of the substrate. When the first processing liquid is solidified or hardened, particles are separated from the substrate. The thus separated particles are held in the particle holding layer. Therefore, in the holding-layer removing step, the peeling liquid is supplied to the upper surface of the substrate, thus making it possible to peel and remove the particle holding layer in a state of holding the particles from the upper surface of the substrate.

Further, according to the above-described configuration, in the liquid film forming step, there is formed a liquid film of the second processing liquid which covers the upper surface of the substrate. Then, in the gas phase layer forming step, the substrate is heated to form a gas phase layer which is composed of a gas resulting from evaporation of the second processing liquid between the liquid film and the upper surface of the substrate. On the gas phase layer, the liquid film of the second processing liquid is held. In this state, the liquid film of the second processing liquid is removed, thus making it possible to suppress or prevent collapse of a pattern on the upper surface of the substrate due to a surface tension of the second processing liquid. The gas phase layer is preferably formed so that an interface with the second processing liquid will be positioned outside a pattern on the upper surface of the substrate. It is, thereby, possible to avoid application of a surface tension of the second processing liquid to the pattern on the upper surface of the substrate and remove the liquid film of the second processing liquid outside the substrate in a state that no surface tension acts thereon.

As described so far, it is possible to satisfactorily remove particles from the upper surface of the substrate and satisfactorily dry the upper surface of the substrate.

In a preferred embodiment of the present invention, the controller is programmed so as to execute a heating step of heating the substrate by using the heater unit. Then, the heating step includes a first heating step of heating the substrate by using the heater unit in order to volatilize at least partially the solvent in the holding-layer forming step and a second heating step of heating the substrate by using the heater unit in order to form the gas phase layer in the gas phase layer forming step.

According to the above-described configuration, in the holding-layer forming step and in the gas phase layer forming step, the common heater unit can be used. Therefore, it is not necessary to provide a plurality of units for heating the substrate.

In a preferred embodiment of the present invention, the substrate processing apparatus further includes a heater raising/lowering unit which raises and lowers the heater unit relatively in relation to the substrate holding unit in order to change a distance between the lower surface of the substrate and the heater unit. Furthermore, the controller is programmed so as to control the heater unit such that the heater unit is constant in temperature in the heating step and also controls the heater raising/lowering unit during execution of the heating step so as to execute a distance changing step of changing a distance between the lower surface of the substrate and the heater unit.

Time necessary for changing a temperature of the heater unit is longer than time necessary for changing a temperature of a substrate. Therefore, in the heating step, where the heater unit is changed in temperature to heat the substrate, it is necessary to wait until the heater unit is changed to a desired temperature in order that the substrate reaches a desired temperature. Therefore, the time necessary for substrate processing may take longer than necessary.

An amount of heat transmitted from the heater unit to a substrate is changed depending on a distance between a lower surface of a substrate and the heater unit. Thus, by changing a distance between the lower surface of the substrate and the heater unit in a state that the heater unit is kept constant in temperature, the temperature of the substrate can be changed to a desired temperature. Therefore, it is possible to save time necessary for changing the temperature of the heater unit. It is also possible to save time necessary for substrate processing.

The shorter the distance between a lower surface of a substrate and the heater unit, the larger the amount of heat transmitted to the substrate, and the substrate is elevated in temperature to a greater extent. For example, in the first heating step, a distance between the lower surface of the substrate and the heater unit is changed so as to give a positional relationship that the lower surface of the substrate is separated from the heater unit, and in the second heating step, a distance between the lower surface of the substrate and the heater unit is changed so as to give a positional relationship that the lower surface of the substrate is in contact with the heater unit. Thereby, a temperature of the substrate in the second heating step can be set higher than a temperature of the substrate in the first heating step.

In a preferred embodiment of the present invention, the controller is programmed so as to execute, in the distance changing step, a step which changes a distance between the lower surface of the substrate and the heater unit in the first heating step according to a film thickness of the particle holding layer which is formed in the holding-layer forming step.

In the first heating step, the solvent is volatilized by heating and, thereby, the particle holding layer undergoes shrinkage. In order that particles are satisfactorily removed from the substrate, in the first heating step, it is preferable that the particle holding layer is allowed to shrink at a desired shrinkage ratio. The shrinkage ratio of the particle holding layer is a ratio of thickness of the particle holding layer after the first heating step in relation to thickness of the first processing liquid on a substrate immediately before start of the first heating step. A heating temperature necessary for allowing the particle holding layer to shrink at a desired shrinkage ratio is varied depending on a film thickness of the particle holding layer. Thus, a distance between the lower surface of the substrate and the heater unit is changed depending on the film thickness of the particle holding layer which is expected to be formed in the holding-layer forming step, thus making it possible to adjust the heating temperature to a temperature according to the film thickness of the particle holding layer. Thereby, the particle holding layer is allowed to shrink at a desired shrinkage ratio, irrespective of the film thickness of the particle holding layer. As a result, it is possible to satisfactorily remove particles.

In a preferred embodiment of the present invention, a solute composition which is the solute contained in the first processing liquid has a property that is insoluble in the peeling liquid before being heated at a temperature equal to or higher than a quality-changing temperature and also changed in quality by being heated at a temperature equal to or higher than the quality-changing temperature and becomes soluble in the peeling liquid. Furthermore, the controller is programmed so as to heat the substrate by using the heater unit such that, in the holding-layer forming step, a temperature of the first processing liquid supplied to the upper surface of the substrate becomes a temperature lower than the quality-changing temperature.

According to the above-described configuration, in the holding-layer forming step, the particle layer is formed by heating a substrate such that a temperature of the first processing liquid becomes a temperature lower than the quality-changing temperature. Therefore, although the particle holding layer is hardly soluble or insoluble in the peeling liquid, it can be peeled by the peeling liquid. Consequently, in the holding-layer removing step, it is possible to peel and remove the particle holding layer in a state of holding particles from the upper surface of the substrate without dissolving the particle holding layer formed on the upper surface of the substrate by using the peeling liquid.

As a result, the particle holding layer in a state of holding particles can be peeled from the upper surface of the substrate to remove the particles at a high removal ratio. It is also possible to suppress residues on the particle holding layer from remaining on the upper surface of the substrate or adhering again thereto.

In a preferred embodiment of the present invention, the controller is programmed to heat the substrate by using the heater unit such that, in the holding-layer forming step, a temperature of the first processing liquid supplied to the upper surface of the substrate becomes a temperature lower than a boiling point of the solvent.

According to the above-described configuration, the solvent is allowed to remain in the particle holding layer after heating in the holding-layer forming step. Therefore, in the subsequent holding-layer removing step, the solvent remaining in the particle holding layer interacts with the supplied peeling liquid, by which the particle holding layer can be easily peeled from the upper surface of the substrate. That is, the peeling liquid is allowed to permeate into the particle holding layer and reach an interface with the substrate and, thereby, the particle holding layer can be floated and peeled from the upper surface of the substrate.

In a preferred embodiment of the present invention, the peeling liquid is compatible with the solvent. In the holding-layer forming step, if the solvent is appropriately allowed to remain in the particle holding layer, the peeling liquid which is compatible with the solvent permeates into the particle holding layer and can reach the interface with the substrate. Thereby, the particle holding layer can be floated and peeled from the upper surface of the substrate.

In a preferred embodiment of the present invention, the substrate processing apparatus further includes a residue-removing liquid supplying unit which supplies, to the upper surface of the substrate, a residue removing liquid which has a property that dissolves a solute composition of the solute contained in the particle holding layer. Furthermore, the controller is programmed so as to execute a residue removing step which removes residues remaining on the upper surface of the substrate after removal of the particle holding layer by supplying the residue removing liquid to the upper surface of the substrate from the residue-removing liquid supplying unit after the holding-layer removing step and also before the liquid film forming step.

According to the above-described configuration, the residue removing liquid has a property that dissolves a solute composition which forms the particle holding layer. Therefore, it is possible to dissolve residues of the particle holding layer in the residue removing liquid and remove them from the upper surface of the substrate.

In a preferred embodiment of the present invention, the second processing liquid supplying unit functions as the residue-removing liquid supplying unit. According to the above configuration, the second processing liquid supplying unit used in the liquid film forming step can be used in the residue removing step as well. Therefore, the residue removing step and the subsequent liquid film forming step can be executed continuously without changing the unit for supplying a liquid to the upper surface of the substrate in the residue removing step or in the liquid film forming step. It is, therefore, possible to shorten the time necessary for substrate processing.

In a preferred embodiment of the present invention, the substrate processing apparatus further includes a gas supplying unit which supplies a gas to the upper surface of the substrate. Furthermore, the controller is programmed so as to execute, in the liquid film removing step, a hole making step in which, after formation of the gas phase layer, a gas is sprayed from the gas supplying unit onto the substrate to remove partially the second processing liquid of the liquid film on the substrate, thereby making a hole in the liquid film, and a hole expanding step in which the hole is expanded to an outer periphery of the substrate and the liquid film is moved on the gas phase layer, thereby removing the second processing liquid which constitutes the liquid film outside the substrate.

According to the above-described configuration, the hole formed in a central region of the liquid film is expanded to an outer periphery of the substrate, thereby removing the liquid film from the substrate. Therefore, it is possible to suppress or prevent droplets of the second processing liquid from remaining on the substrate. It is, thus, possible to satisfactorily dry the upper surface of the substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a flowchart for describing one example of substrate processing by the substrate processing apparatus.

DETAILED DESCRIPTION OF THE PREFERRED EMBODIMENTS

Figure 1:
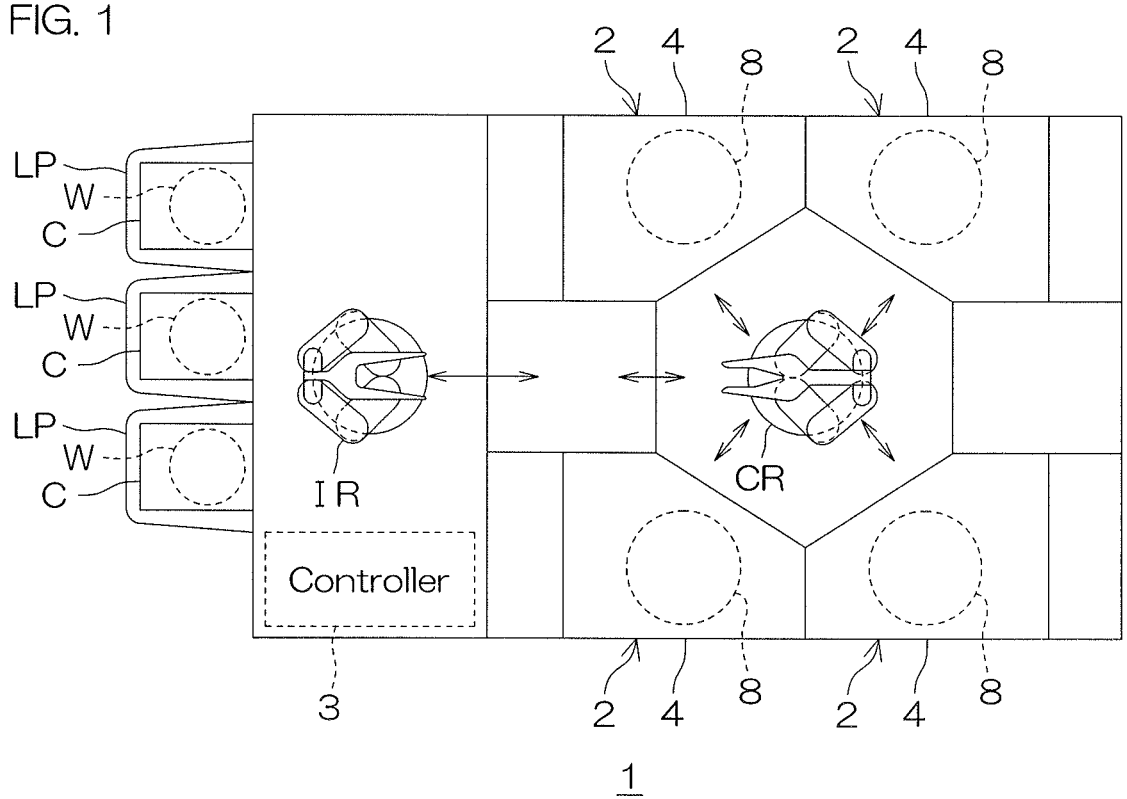
FIG. 1 is a schematic plan view for describing a layout of the inside of a substrate processing apparatus according to a preferred embodiment of the present invention.

FIG. 1 is a schematic plan view for describing a layout of the inside of a substrate processing apparatus 1 according to a preferred embodiment of the present invention. The substrate processing apparatus 1 is a single substrate processing type apparatus which processes a substrate W such as silicon wafer one at a time. With reference to FIG. 1, the substrate processing apparatus 1 includes a plurality of processing units 2 which process substrates W by a processing fluid, a load port LP which places a carrier C for housing a plurality of substrates W processed by the processing unit 2, transfer robots IR and CR for transferring a substrate W between the load port LP and the processing unit 2, and a controller 3 which controls the substrate processing apparatus 1.

The transfer robot IR transfers a substrate W between the carrier C and the transfer robot CR. The transfer robot CR transfers a substrate W between the transfer robot IR and the processing unit 2. The plurality of processing units 2 are similar in configuration, for example. Processing fluids include a liquid such as a first processing liquid, a second processing liquid, a rinse liquid, a peeling liquid and a residue removing liquid and a gas such as an inert gas which will be described later.

Figure 2:
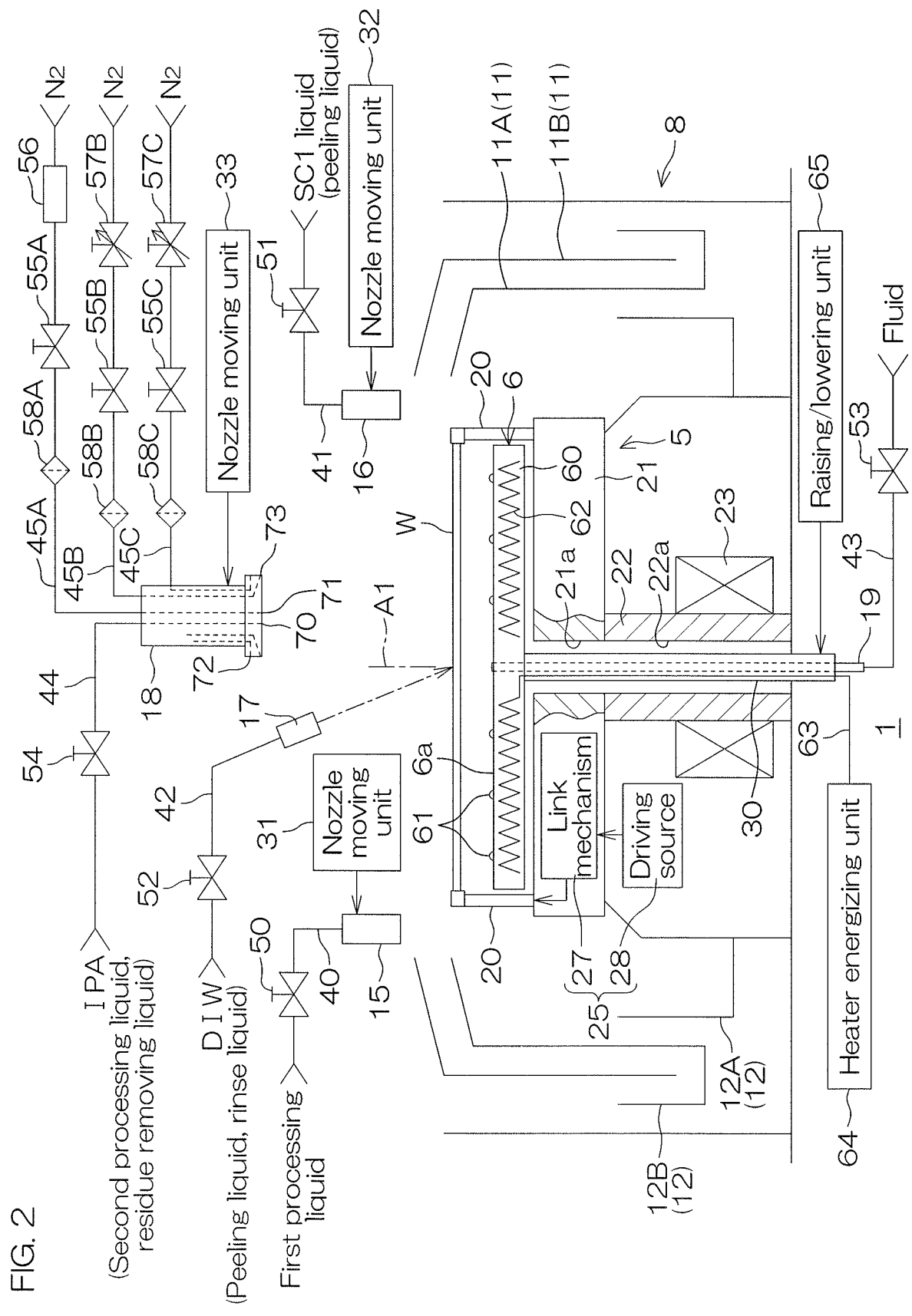
FIG. 2 is a schematic view of a processing unit included in the substrate processing apparatus.

FIG. 2 is a schematic view for describing a configuration example of the processing unit 2. The processing unit 2 includes a spin chuck 5, a processing cup 8, a first movement nozzle 15, a second movement nozzle 16, a fixed nozzle 17, a third movement nozzle 18, a lower surface nozzle 19 and a heater unit 6.

The spin chuck 5 rotates a substrate W around a vertical rotation axis A1 which passes through a central portion of the substrate W, with the substrate W held horizontally. The spin chuck 5 is an example of a substrate holding unit which holds a substrate W horizontally. The substrate holding unit is also referred to as a substrate holder. The spin chuck 5 includes a plurality of chuck pins 20, a spin base 21, a rotating shaft 22 and an electric motor 23.

The spin base 21 has a disk shape along a horizontal direction. On an upper surface of the spin base 21, the plurality of chuck pins 20 are disposed at intervals in a circumferential direction. The plurality of chuck pins 20 can be opened and closed between a closed state in which they are in contact with a peripheral end of a substrate W and have a grip on the substrate W and an opened state in which they are retracted from the peripheral end of the substrate W. Further, in the opened state, the plurality of chuck pins 20 support the substrate W from below in contact with a lower surface of the substrate W at a peripheral edge portion, while being separated from the peripheral end of the substrate W to release the grip.

The processing unit 2 further includes a chuck pin driving unit 25 which drives the plurality of chuck pins 20 in an opening and closing manner. The chuck pin driving unit 25 includes, for example, a link mechanism 27 housed inside the spin base 21 and a driving source 28 disposed outside the spin base 21. The driving source 28 includes, for example, a ball screw mechanism and an electric motor which drives the mechanism.

The rotating shaft 22 extends in a vertical direction along the rotation axis A1. An upper end portion of the rotating shaft 22 is coupled to a lower surface center of the spin base 21. A penetrating hole 21a which penetrates through the spin base 21 in an up/down direction is formed at a central region of the spin base 21 in a plan view. The penetrating hole 21a is communicatively connected to an internal space 22a of the rotating shaft 22.

The electric motor 23 applies a rotating force to the rotating shaft 22. The rotating shaft 22 is rotated by the electric motor 23 to rotate the spin base 21. Thereby, a substrate W is rotated around the rotation axis A1. In the following description, an inner side in a radial direction at the center of the rotation axis A1 is simply referred to as the "radially inner side" and an outer side in the radial direction at the center of the rotation axis A1 is simply referred to as the "radially outer side." The electric motor 23 is included in a substrate rotating unit which rotates a substrate W around the rotation axis A1.

The processing cup 8 includes a plurality of guards 11 for receiving a liquid scattered outside from a substrate W held by the spin chuck 5, a plurality of cups 12 for receiving the liquid guided downward by the plurality of guards 11 and a cylindrical outer wall member 13 which surrounds the plurality of guards 11 and the plurality of cups 12. In this preferred embodiment, there is shown an example in which two guards 11 (a first guard 11A and a second guard 11B) and two cups 12 (a first cup 12A and a second cup 12B) are provided.

The first cup 12A and the second cup 12B each assume a groove shape which is opened upward. The first guard 11A surrounds the spin base 21. The second guard 11B surrounds the spin base 21 at the radially outer side from the first guard 11A. The first cup 12A receives a liquid guided downward by the first guard 11A. The second cup 12B is formed integrally with the first guard 11A and receives a liquid guided downward by the second guard 11B.

Again with reference to FIG. 1, the processing cup 8 is housed inside a chamber 4. In the chamber 4, there are formed an entrance/exit (not shown) for carrying a substrate W into the chamber 4 and carrying out the substrate W from the chamber 4. The chamber 4 is provided with a shutter unit (not shown) for opening and closing the entrance/exit.

Again with reference to FIG. 2, the first movement nozzle 15 is an example of the first processing liquid supplying unit for supplying (discharging) a first processing liquid to an upper surface of a substrate W. The first processing liquid discharged from the first movement nozzle 15 contains a solute and a volatile solvent. The first processing liquid is solidified or hardened by volatilizing at least partially the solvent, thereby forming a particle holding layer which separates particles adhered to the upper surface of the substrate W from the substrate W and holds the particles.

Here, "solidification" means that, for example, in association with volatilization of a solvent, a solute becomes hard by a force, etc., exerting between molecules or between atoms. "Curing" means that a solute becomes hard, for example, due to a chemical change such as polymerization or cross linkage. "Solidification or curing" thus expresses "hardening" of a solute due to various factors.

A resin which is used as a solute of the first processing liquid is a resin which has a property that is, for example, hardly soluble or insoluble in water before being heated at a temperature equal to or higher than a predetermined quality-changing temperature and changed in quality by being heated at a temperature equal to or higher than the quality-changing temperature and becomes water-soluble (hereinafter, the resin is from time to time described as "a heat-sensitive water-soluble resin").

The heat-sensitive water-soluble resin is decomposed, for example, by being heated at a temperature equal to or higher than a predetermined quality-changing temperature (for example, 200° C. or higher) to expose a functional group having polarity, thereby developing water solubility.

As the solvent of the first processing liquid, there can be used a solvent having a property that dissolves a heat-sensitive water-soluble resin before a change in quality and is also volatile. Here, "being volatile" means being higher in volatility than water. As the solvent of the first processing liquid, there is used, for example, PGEE (propylene glycol monoethyl ether).

The first movement nozzle 15 is connected to a first processing liquid piping 40 which guides the first processing liquid. When a first processing liquid valve 50 which is interposed in the first processing liquid piping 40 is opened, the first processing liquid is continuously discharged downward from a discharge port of the first movement nozzle 15.

The first movement nozzle 15 is moved by a first nozzle moving unit 31 in the horizontal direction and the vertical direction. The first movement nozzle 15 is able to move between a center position and a home position (retracted position). The first movement nozzle 15 faces a rotation center of an upper surface of a substrate W when being at the center position. The rotation center of the upper surface of the substrate W is an intersection of the rotation axis A1 on the upper surface of the substrate W. The first movement nozzle 15 does not face the upper surface of the substrate W and is positioned outside the processing cup 8 in a plan view, when being at the home position. The first movement nozzle 15 is able to come close to the upper surface of the substrate W or retract above from the upper surface of the substrate W by movement in the vertical direction.

The first nozzle moving unit 31 includes, for example, a pivoting shaft along the vertical direction, an arm which is coupled to the pivoting shaft and extends horizontally and a pivoting shaft driving unit which raises and lowers or pivots the pivoting shaft. The pivoting shaft driving unit pivots the pivoting shaft around a vertical pivoting axis, thereby swinging the arm. Further, the pivoting shaft driving unit raises and lowers the pivoting shaft along the vertical direction to move the arm up and down. The first movement nozzle 15 is fixed to the arm. The first movement nozzle 15 moves in the horizontal direction and the vertical direction in response to the arm which is swung or raised and lowered.

The second movement nozzle 16 is an example of the peeling liquid supplying unit which supplies (discharges) a peeling liquid to an upper surface of a substrate W. The peeling liquid is a liquid for peeling the particle holding layer which is constituted by the first processing liquid from the upper surface of the substrate W. A liquid compatible with a solvent contained in the first processing liquid is preferably used as the peeling liquid.

The peeling liquid is, for example, a water-based peeling liquid. The water-based peeling liquid is not limited to DIW but includes carbonated water, electrolyzed water, hydrogen water, ozone water, an aqueous hydrochloric acid solution of dilute concentration of (for example, approximately 10 ppm to 100 ppm) and an alkaline solution. The alkaline solution includes SC1 liquid (ammonia-hydrogen peroxide mixture), ammonia aqueous solution, quaternary ammonium hydroxide aqueous solution such as tetramethyl ammonium hydroxide, and Choline aqueous solution.

In this preferred embodiment, the second movement nozzle 16 is connected to an SC1 liquid piping 41 for guiding SC1 liquid. When an SC1 liquid valve 51 which is interposed in the SC1 liquid piping 41 is opened, SC1 liquid as a peeling liquid is continuously discharged downward from a discharge port of the second movement nozzle 16.

The second movement nozzle 16 is moved in the horizontal direction and the vertical direction by a second nozzle moving unit 32. The second movement nozzle 16 is able to move between a center position and a home position (retracted position). The second movement nozzle 16 faces the rotation center of an upper surface of a substrate W when being at the center position. The second movement nozzle 16 does not face the upper surface of the substrate W and is positioned outside the processing cup 8 in a plan view, when being at the home position. The second movement nozzle 16 is able to move close to the upper surface of the substrate W or retracts above from the upper surface of the substrate W by movement in the vertical direction.

The second nozzle moving unit 32 is similar in configuration to the first nozzle moving unit 31. That is, the second nozzle moving unit 32 includes, for example, a pivoting shaft along the vertical direction, an arm which is coupled to the pivoting shaft and the second movement nozzle 16 and extends horizontally, and a pivoting shaft driving unit which raises and lowers or pivots the pivoting shaft.

The fixed nozzle 17 is an example of the rinse liquid supplying unit for supplying (discharging) a rinse liquid to an upper surface of a substrate W.

The rinse liquid is, for example, DIW. In addition to DIW, the rinse liquid includes carbonated water, electrolyzed water, hydrogen water, ozone water, ammonia water and aqueous hydrochloric acid solution of dilute concentration (of, for example, approximately 10 ppm to 100 ppm).

In this preferred embodiment, the fixed nozzle 17 is connected to a DIW piping 42 for guiding DIW. When a DIW valve 52 which is interposed in the DIW piping 42 is opened, DIW is continuously discharged downward from a discharge port of the fixed nozzle 17. As described previously, since DIW also functions as a peeling liquid, the fixed nozzle 17 functions as a peeling liquid supplying unit for supplying (discharging) the peeling liquid to an upper surface of a substrate W.

The third movement nozzle 18 functions as a second processing liquid supplying unit for supplying (discharging) a second processing liquid to an upper surface of a substrate W and also functions as a gas supplying unit for supplying (discharging) a gas such as nitrogen gas ($N_2$ gas) to the upper surface of the substrate W.

The second processing liquid is, for example, a low surface-tension liquid lower in surface tension than water. As the low surface-tension liquid, there can be used an organic solvent which will not chemically react with an upper surface of a substrate W or a pattern formed on the substrate W (poor in reaction). More specifically, a liquid which contains at least one of IPA, HFE (hydrofluoroether), methanol, ethanol, acetone and trans-1, 2-dichloroethylene can be used as a low surface-tension liquid. Further, the low surface-tension liquid is not required to be composed of a single composition alone but may be a liquid mixed with other compositions. For example, it may be a mixture of IPA liquid and pure water or a mixture of IPA liquid and HFE liquid.

A gas which is discharged from the third movement nozzle 18 is preferably an inert gas. The inert gas is a gas which is inactive with an upper surface of a substrate W or a pattern and may be a rare gas such as argon, for example. A gas which is discharged from the third movement nozzle 18 may be air.

The third movement nozzle 18 is provided with a center discharge port 70 which discharges a second processing liquid along the vertical direction. The third movement nozzle 18 is provided with a linear flow discharge port 71 which discharges a linear gas along the vertical direction. The third movement nozzle 18 is also provided with a horizontal flow discharge port 72 which discharges a gas radially around the third movement nozzle 18 along the horizontal direction. The third movement nozzle 18 is also provided with an inclined flow discharge port 73 which discharges a gas radially around the third movement nozzle 18 along an inclined downward direction.

The gas discharged from the linear flow discharge port 71 forms a linear air flow which enters perpendicularly into an upper surface of a substrate W. The gas discharged from the horizontal flow discharge port 72 forms a horizontal air flow which is parallel with the upper surface of the substrate W and also covers the upper surface of the substrate W. The gas discharged from the inclined flow discharge port 73 forms an inclined air flow having a conical profile which obliquely enters the upper surface of the substrate W.

An IPA piping 44 and a plurality of nitrogen gas pipings 45A, 45B and 45C are connected to the third movement nozzle 18. When an IPA valve 54 which is interposed in the IPA piping 44 is opened, IPA is continuously discharged downward from a center discharge port 70 of the third movement nozzle 18.

When a first nitrogen gas valve 55A which is interposed in the first nitrogen gas piping 45A is opened, nitrogen gas is continuously discharged downward from the linear flow discharge port 71 of the third movement nozzle 18. When a second nitrogen gas valve 55B which is interposed in the second nitrogen gas piping 45B is opened, nitrogen gas is continuously discharged horizontally from the horizontal flow discharge port 72 of the third movement nozzle 18. When a third nitrogen gas valve 55C which is interposed in the third nitrogen gas piping 45C is opened, nitrogen gas is continuously discharged obliquely downward from the inclined flow discharge port 73 of the third movement nozzle 18.

A mass flow controller 56 for accurately adjusting a flow rate of nitrogen gas flowing inside the first nitrogen gas piping 45A is interposed in the first nitrogen gas piping 45A. The mass flow controller 56 is provided with a flow rate control valve. Further, a flow rate variable valve 57B for adjusting a flow rate of nitrogen gas flowing inside the second nitrogen gas piping 45B is interposed in the second nitrogen gas piping 45B. Still further, a flow rate variable valve 57C for adjusting a flow rate of nitrogen gas flowing inside the third nitrogen gas piping 45C is interposed in the third nitrogen gas piping 45C. In addition, filters 58A, 58B and 58C for removing foreign matter are respectively interposed in the nitrogen gas pipings 45A, 45B and 45C.

IPA discharged from the center discharge port 70 of the third movement nozzle 18 is also a second processing liquid (low surface-tension liquid) and also a residue removing liquid. The residue removing liquid is a liquid which has a property that dissolves a solute of the first processing liquid. Therefore, the third movement nozzle 18 also functions as a residue processing liquid supplying unit for supplying (discharging) the residue removing liquid to an upper surface of a substrate W.

Where the heat-sensitive water-soluble resin is used as a solute of the first processing liquid, as the residue removing liquid, there may be used a liquid having a property that dissolves the heat-sensitive water-soluble resin before a change in quality. Where the heat-sensitive water-soluble resin is used as the solute of the first processing liquid, a liquid used as the residue removing liquid is, for example, IPA. The residue removing liquid is preferably a liquid which is compatible with a water-based peeling liquid.

The third movement nozzle 18 is moved by the third nozzle moving unit 33 in the horizontal direction and the vertical direction. The third movement nozzle 18 is able to move between a center position and a home position (retracted position). The third movement nozzle 18 faces a rotation center of an upper surface of a substrate W when being at the center position. The third movement nozzle 18 does not face the upper surface of the substrate W and is positioned outside the processing cup 8 in a plan view, when being at the home position. More specifically, the third movement nozzle 18 is able to come close to the upper surface of the substrate W or retract above from the upper surface of the substrate W by movement in the vertical direction.

The third nozzle moving unit 33 is similar in configuration to the first nozzle moving unit 31. That is, the third nozzle moving unit 33 includes, for example, a pivoting shaft along the vertical direction, an arm which is coupled to the pivoting shaft and the third movement nozzle 18 and extends horizontally, and a pivoting shaft driving unit which raises and lowers or pivots the pivoting shaft.

The heater unit 6 is formed in a disk-like hot plate. The heater unit 6 is provided with a facing surface 6a which faces a lower surface of a substrate W from below.

The heater unit 6 includes a plate main body 60, a plurality of support pins 61 and a heater 62. The plate main body 60 is slightly smaller than a substrate W in a plan view. The plurality of support pins 61 protrude from an upper surface of the plate main body 60. The facing surface 6a is constituted with the upper surface of the plate main body 60 and a surface of the plurality of support pins 61. The heater 62 may be a resistor element housed inside the plate main body 60. Power is supplied to the heater 62 to heat the facing surface 6a. Power is supplied from a heater energizing unit 64 to the heater 62 via a feed line 63.

The heater unit 6 is disposed above the spin base 21. The processing unit 2 includes a heater raising/lowering unit 65 which relatively raises and lowers the heater unit 6 in relation to the spin base 21. The heater raising/lowering unit 65 includes, for example, a ball screw mechanism and an electric motor which drives the mechanism. The heater raising/lowering unit 65 is also referred to as a heater lifter.

A raising/lowering shaft 30 which extends in the vertical direction along the rotation axis A1 is coupled to a lower surface of the heater unit 6. The raising/lowering shaft 30 is inserted through a penetrating hole 21a formed at the central portion of the spin base 21 and a hollow rotating shaft 22. The feed line 63 passes through the raising/lowering shaft 30. The heater raising/lowering unit 65 raises and lowers the heater unit 6 via the raising/lowering shaft 30, thus making it possible to dispose the heater unit 6 at any given intermediate position between a lower position and an upper position. When the heater unit 6 is positioned at the lower position, a distance between the facing surface 6a and a lower surface of a substrate W is, for example, 15 mm.

Since the heater unit 6 is relatively raised and lowered (moved) in relation to the spin base 21, a distance between a lower surface of a substrate W and an upper surface of the heater unit 6 is changed. That is, the heater raising/lowering unit 65 functions as a distance changing unit.

The lower surface nozzle 19 is inserted through the hollow raising/lowering shaft 30 and also penetrates through the heater unit 6. The lower surface nozzle 19 is provided, at an upper end thereof, with a discharge port which faces a lower surface center of a substrate W. A fluid piping 43 is connected to the lower surface nozzle 19. When a fluid valve 53 which is interposed in the fluid piping 43 is opened, a processing fluid is continuously discharged to the lower surface of the substrate W.

Figure 3:
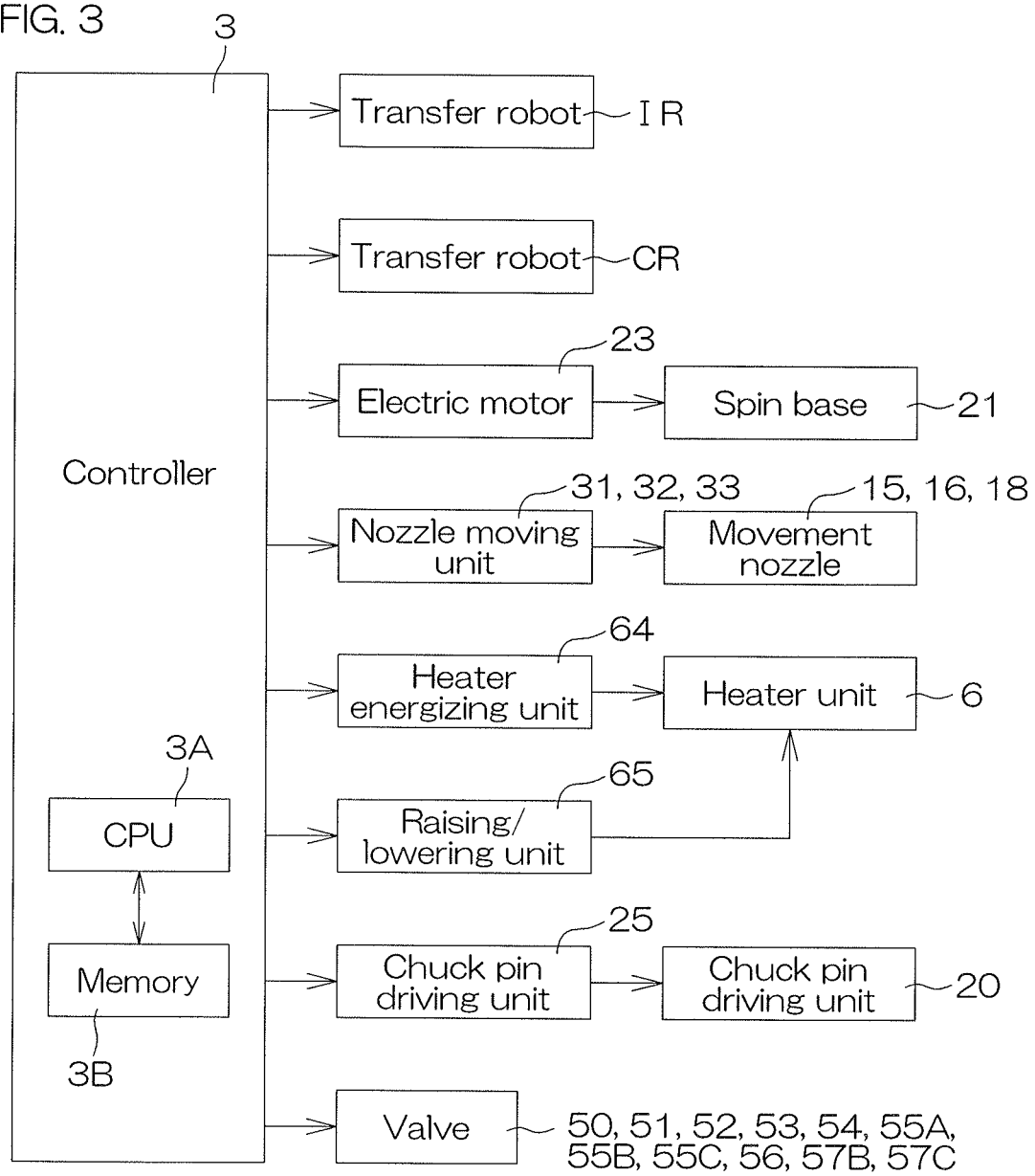
FIG. 3 is a block diagram for describing an electrical configuration of main portions of the substrate processing apparatus.

FIG. 3 is a block diagram for describing an electrical arrangement of main portions of the substrate processing apparatus 1. The controller 3 is provided with a microcomputer and controls control targets installed on the substrate processing apparatus 1 according to predetermined programs. More specifically, the controller 3 includes a processor (CPU) 3A and a memory 3B which houses programs and is constituted so as to execute various types of control for substrate processing by the processor 3A which executes programs.

The controller 3 controls, in particular, motions of the transfer robot IR, the transfer robot CR, the electric motor 23, the first nozzle moving unit 31, the second nozzle moving unit 32, the third nozzle moving unit 33, the heater energizing unit 64, the heater raising/lowering unit 65, the chuck pin driving unit 25, the first processing liquid valve 50, the SC1 liquid valve 51, the DIW valve 52, the fluid valve 53, the IPA valve 54, the first nitrogen gas valve 55A, the second nitrogen gas valve 55B, the third nitrogen gas valve 55C, the mass flow controller 56, the flow rate variable valve 57B, and the flow rate variable valve 57C, etc. The first processing liquid valve 50, the SC1 liquid valve 51, the DIW valve 52, the fluid valve 53, the IPA valve 54, the first nitrogen gas valve 55A, the second nitrogen gas valve 55B, the third nitrogen gas valve 55C, the mass flow controller 56, the flow rate variable valve 57B, and the flow rate variable valve 57C are controlled, thereby controlling the presence or absence of a fluid that is discharged from corresponding nozzles and a flow rate of discharge.

FIG. 4 is a flowchart for describing one example of substrate processing by the substrate processing apparatus 1 in which processing is performed mainly by the controller 3 which executes programs. FIG. 5A to FIG. 5M are each an illustrative sectional view for describing the substrate processing.

A substrate W which is not processed is carried into the processing unit 2 from the carrier C by the transfer robots IR and CR and delivered to the spin chuck 5 (S1). Then, the plurality of chuck pins 20 are turned to the closed state. Thereby, the substrate W is held horizontally by the spin chuck 5 (substrate holding step).

Then, the heater raising/lowering unit 65 disposes the heater unit 6 at a lower position. Power is supplied to the heater energizing unit 64 constantly during substrate processing. Therefore, a substrate W is kept heated by the heater unit 6 (heating step) until being carried outside by the transfer robot CR. Further, in the heating step, the heater unit 6 is kept constant in temperature (for example, 195° C.) During execution of the heating step, the heater raising/lowering unit 65 raises and lowers the heater unit 6, thereby changing a distance between a lower surface of the substrate W and the facing surface 6a of the heater unit 6 (distance changing step).

Figure 5A:
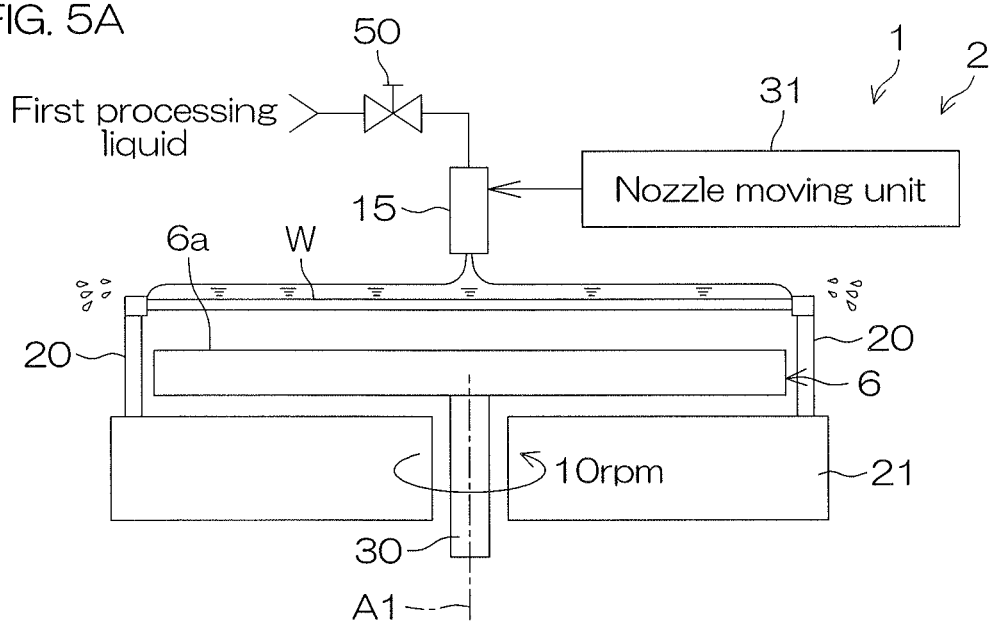
FIG. 5A to FIG. 5M are each an illustrative sectional view for describing the substrate processing.

Then, with reference to FIG. 5A, a first processing liquid supplying step is executed (S2). The first processing liquid supplying step is executed, for example, for 2.4 seconds. In the first processing liquid supplying step, at first, the electric motor 23 (refer to FIG. 2) rotates the spin base 21. Thereby, a substrate W is rotated. In the first processing liquid supplying step, the spin base 21 is rotated at a predetermined first processing liquid supplying speed. The first processing liquid supplying speed is, for example, 10 rpm.

Next, the first nozzle moving unit 31 disposes the first movement nozzle 15 at a center position. Then, the first processing liquid valve 50 is opened. Thereby, a first processing liquid is supplied from the first movement nozzle 15 to an upper surface of a substrate W in a rotating state. The first processing liquid supplied to the upper surface of the substrate W spreads over an entirety of the upper surface of the substrate W due to a centrifugal force. An excess first processing liquid is removed at the radially outer side from the substrate W due to a centrifugal force.

After the first processing liquid has been supplied for a certain period of time to a substrate W, there is executed a holding-layer forming step in which the first processing liquid is solidified or cured to form a particle holding layer 100 on an upper surface of the substrate W (refer to FIG. 5C) (S3). In the holding-layer forming step, at first, the first processing liquid valve 50 is closed. Thereby, supply of the first processing liquid from the first movement nozzle 15 is stopped. Then, the first movement nozzle 15 is moved to a retracted position by the first nozzle moving unit 31.

Figure 5B:
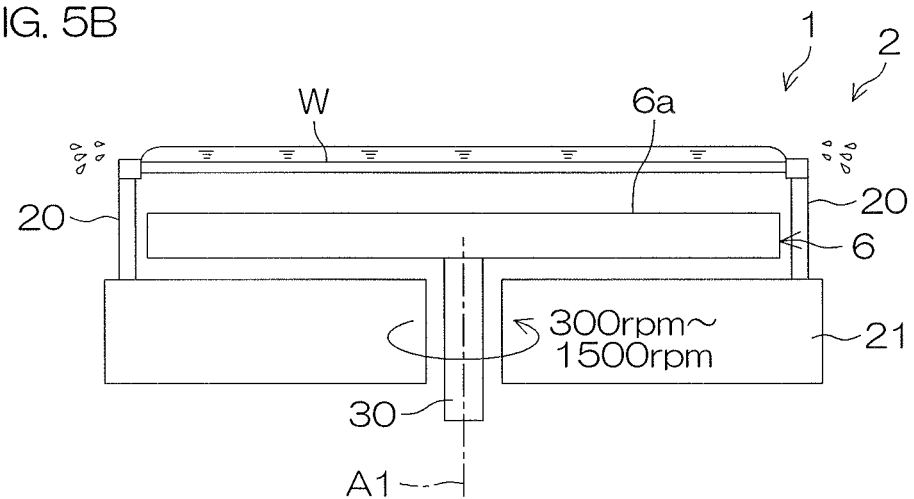

With reference to FIG. 5B, in the holding-layer forming step, at first, in order that a liquid film of the first processing liquid on a substrate W is adjusted appropriately for the thickness thereof, executed is a spin off step in which the first processing liquid is partially removed from an upper surface of the substrate W by a centrifugal force.

In the spin off step, the electric motor 23 changes a rotating speed of the spin base 21 to a predetermined spin off speed. The spin off speed is, for example, 300 rpm to 1500 rpm. The rotating speed of the spin base 21 may be kept constant in a range of 300 rpm to 1500 rpm or may be changed whenever necessary during the spin off step within a range of 300 rpm to 1500 rpm. The spin off step is executed, for example, for 30 seconds.

Figure 5C:
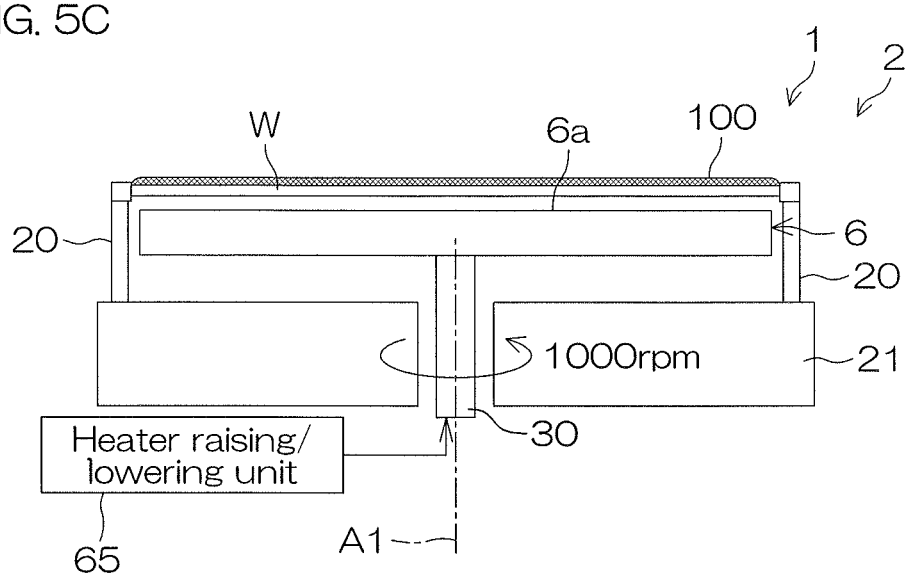

With reference to FIG. 5C, in the holding-layer forming step, after the spinoff step, there is executed a first heating step in which a substrate W is heated (heating to the substrate W is increased) in order to volatilize partially a solvent of the first processing liquid on the substrate W.

In the first heating step, the heater raising/lowering unit 65 disposes the heater unit 6 at a proximity position. The proximity position is a position between the lower position and the upper position. When the heater unit 6 is at the proximity position, the facing surface 6a is not in contact with a lower surface of a substrate W. When the heater unit 6 is at the proximity position, the facing surface 6a is separated downward only by a predetermined distance (for example, 4 mm) from the lower surface of the substrate W. The first heating step is executed, for example, for 60 seconds. In the first heating step, the electric motor 23 changes the rotating speed of the spin base 21 to a predetermined first speed on heating. The first speed on heating is, for example, 1000 rpm.

In the first heating step, a substrate W is preferably heated such that a temperature of the first processing liquid on the substrate W is lower than a boiling point of the solvent. The first processing liquid is heated to a temperature lower than a boiling point of the solvent, by which the solvent is allowed to remain in the particle holding layer 100 as described previously. Then, the solvent which remains in the particle holding layer 100 interacts with the peeling liquid, thus making it possible to easily peel the particle holding layer 100 from the upper surface of the substrate W.

In the first heating step, it is preferable that a substrate W is heated so that not only a temperature of the first processing liquid on the substrate W will be lower than a boiling point of the solvent but also the temperature of the first processing liquid on the substrate W will be lower than a quality-changing temperature of the heat-sensitive water-soluble resin. The first processing liquid is heated to a temperature lower than a quality-changing temperature, by which the heat-sensitive water-soluble resin is not changed in quality so as to be water soluble but the particle holding layer 100 which is hardly soluble or insoluble in a water-based peeling liquid can be formed on the upper surface of the substrate W.

Figure 6A:
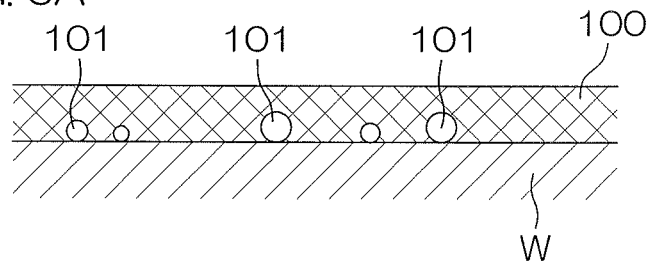
FIG. 6A and FIG. 6B are each an illustrative sectional view for describing a mode of a particle holding layer in the substrate processing.

The first heating step is executed and, thereby, the first processing liquid is solidified or hardened to form the particle holding layer 100 on a substrate W. As shown in FIG. 6A, when the particle holding layer 100 is formed, particles 101 adhered to an upper surface of the substrate W are detached from the substrate W and held in the particle holding layer 100.

The first processing liquid may be solidified or hardened only to such an extent that can hold the particles 101. It is not necessary that the solvent of the first processing liquid is completely volatilized. Further, the "solute composition" which forms the particle holding layer 100 may be a solute itself which is contained in the first processing liquid or may be a substance derived from the solute, for example, a substance obtained from a result of chemical change.

Figure 5D:
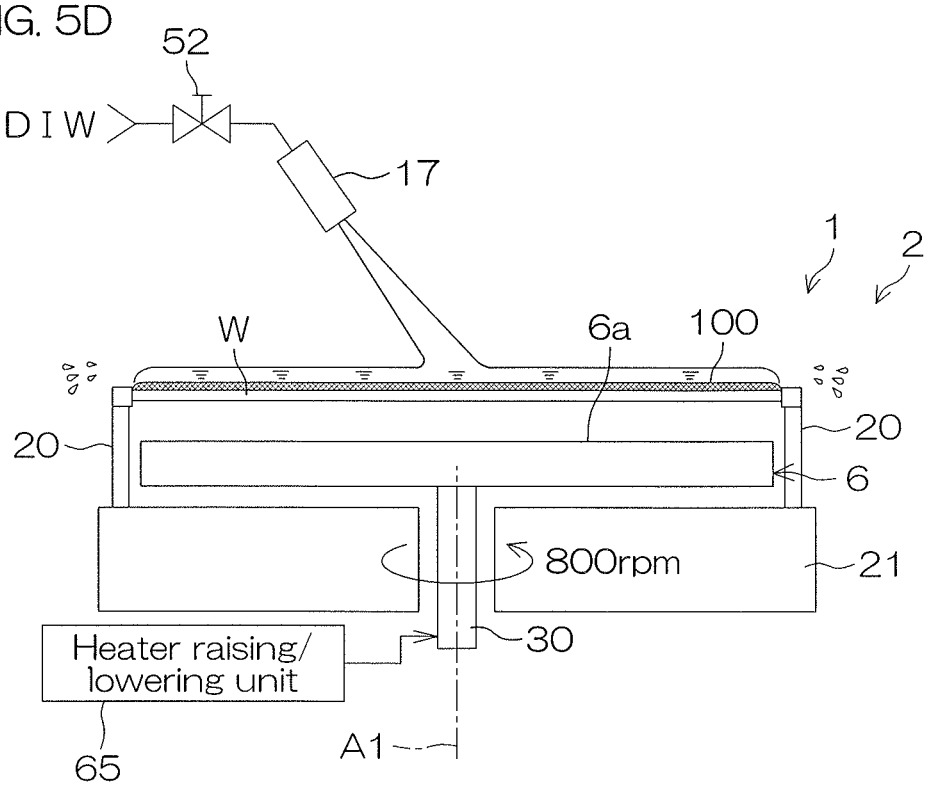
Figure 5E:
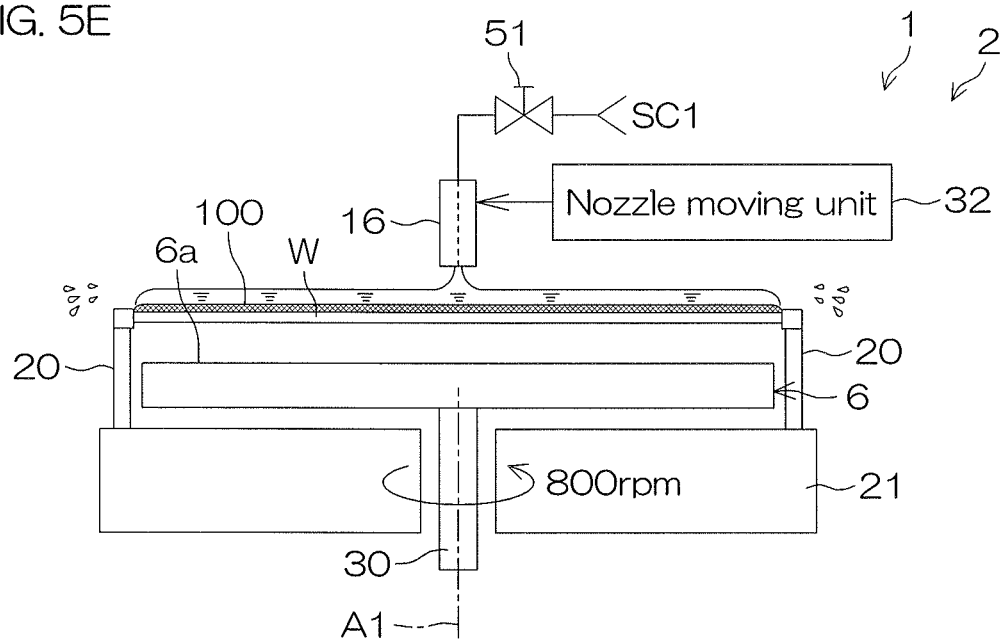

As shown in FIG. 5D and FIG. 5E, after the holding-layer forming step, there is executed a holding-layer removing step in which a peeling liquid is supplied to an upper surface of a substrate W to peel and remove the particle holding layer 100 from the upper surface of the substrate W (S4). In the holding-layer removing step, there are executed a first peeling liquid supplying step in which, as the first peeling liquid, DIW is supplied to the upper surface of the substrate W and a second peeling liquid supplying step in which, as the second peeling liquid, SC1 liquid is supplied.

With reference to FIG. 5D, in the first peeling liquid supplying step, the electric motor 23 changes the rotating speed of the spin base 21 to a predetermined first peeling liquid speed. The first peeling liquid speed is, for example, 800 rpm. Next, the heater raising/lowering unit 65 moves the heater unit 6 to the lower position. Then, the DIW valve 52 is opened. Thereby, DIW is supplied from the fixed nozzle 17 to the upper surface of the substrate W in a rotating state. DIW supplied to the upper surface of the substrate W spreads over an entirety of the upper surface of the substrate W due to a centrifugal force. Excess DIW is removed from the substrate W at the radially outer side due to a centrifugal force. The first peeling liquid supplying step continues, for example, for 60 seconds.

With reference to FIG. 5E, in the second peeling liquid supplying step, the electric motor 23 changes the rotating speed of the spin base 21 to a predetermined second peeling liquid speed. The second peeling liquid speed is, for example, 800 rpm. Therefore, in the second peeling liquid supplying step, the rotating speed of a substrate W in the first peeling liquid supplying step is kept. Next, the second nozzle moving unit 32 moves the second movement nozzle 16 to a center position. Then, the DIW valve 52 is closed. On the other hand, the SC1 liquid valve 51 is opened. Thereby, SC1 liquid is supplied from the second movement nozzle 16 to an upper surface of the substrate W in a rotating state. SC1 liquid supplied to the upper surface of the substrate W spreads over an entirety of the upper surface of the substrate W due to a centrifugal force to replace DIW on the substrate W. Excess SC1 liquid is removed from the substrate W at the radially outer side due to a centrifugal force. In the second peeling liquid supplying step, the heater unit 6 is kept at the lower position.

Figure 6B:
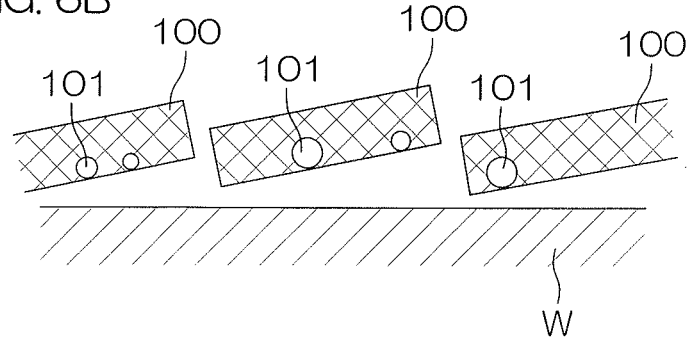

DIW and SC1 liquid are both compatible with PGEE as the solvent. Further, the particle holding layer 100 which is formed by heating a heat-sensitive water-soluble resin at a temperature lower than the quality-changing temperature thereof is, as described previously, hardly soluble or insoluble in DIW and SC1 liquid which are water-based peeling liquids. Therefore, these peeling liquids permeate into the particle holding layer 100 without dissolving a solute composition which forms the particle holding layer 100 by interactions with PGEE remaining in the particle holding layer 100. Then, the peeling liquids reach an interface with the substrate W. Thereby, as shown in FIG. 6B, the particle holding layer 100 which holds the particles 101 is floated and peeled from the upper surface of the substrate W.

The particle holding layer 100 which has been peeled from the upper surface of the substrate W is drained from a peripheral edge of the upper surface of the substrate W together with the peeling liquid due to actions of a centrifugal force resulting from rotation of the substrate W. That is, the peeled particle holding layer 100 is removed from the upper surface of the substrate W.

DIW is less effective than SC1 liquid as a peeling liquid. However, DIW is supplied prior to SC1 liquid and permeates into the particle holding layer 100 to replace at least partially PGEE which remains in the particle holding layer 100. Then, DIW serves to assist permeation of SC1 liquid which is supplied in a subsequent step into the particle holding layer 100.

Therefore, it is preferable that DIW is supplied prior to supply of SC1 liquid as a peeling liquid. However, supply of DIW (first peeling liquid supplying step) may be omitted. That is, only SC1 liquid may be used as a peeling liquid.

Figure 5F:
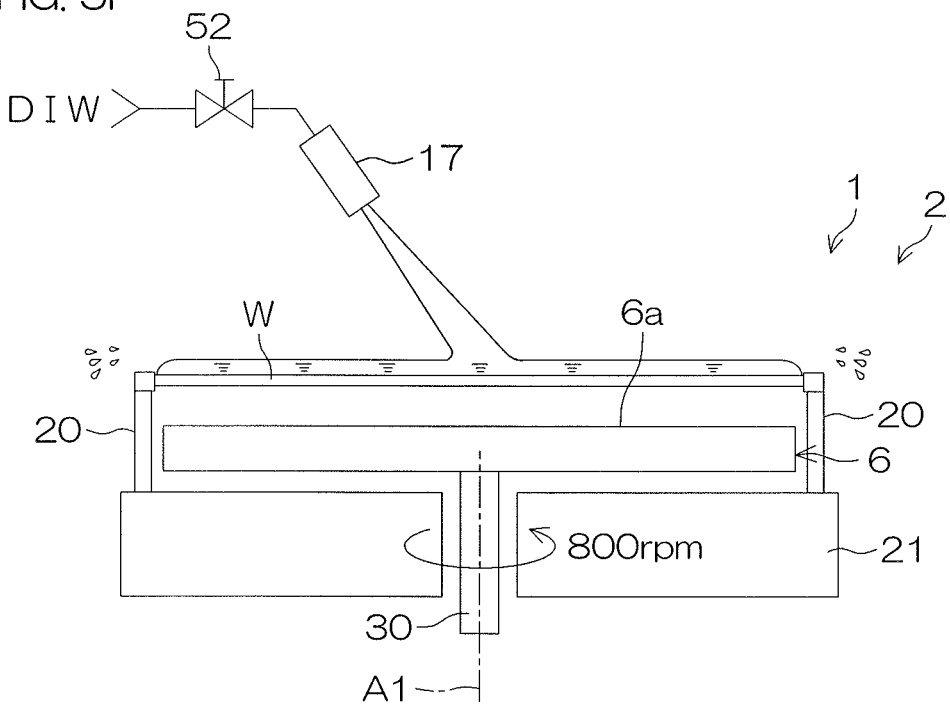

With reference to FIG. 5F, after the holding-layer removing step, a rinse step is executed in which the peeling liquid on a substrate W is replaced by a rinse liquid (S5). The rinse step is executed, for example, for 60 seconds.

In the rinse step, the electric motor 23 changes the rotating speed of the spin base 21 to a predetermined rinse speed. The rinse speed is, for example, 800 rpm. Therefore, in the rinse step, the rotating speed of a substrate W in the second peeling liquid supplying step is kept. Then, the SC1 liquid valve 51 is closed and the second nozzle moving unit 32 moves the second movement nozzle 16 to the retracted position. Then, the DIW valve 52 is again opened. Thereby, DIW is supplied from the fixed nozzle 17 to the upper surface of the substrate W in a rotating state. DIW supplied to the upper surface of the substrate W spreads over the entirety of the upper surface of the substrate W due to a centrifugal force to replace SC1 liquid on the substrate W. Excess DIW is removed from the substrate W at the radially outer side due to a centrifugal force.

Figure 5G:
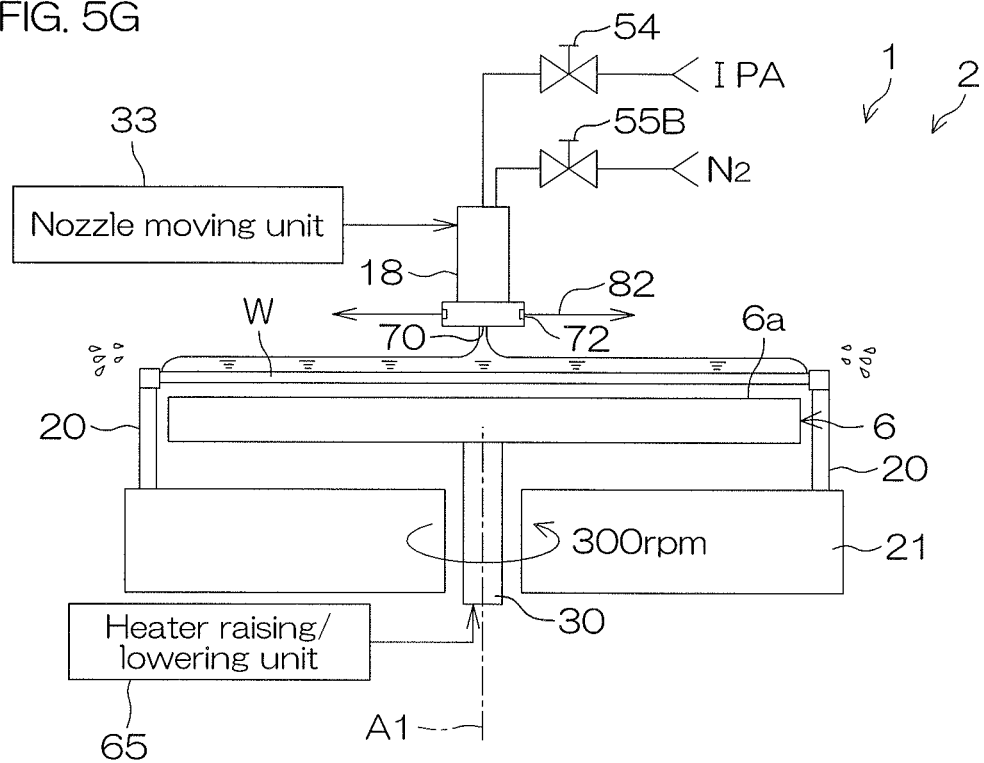

With reference to FIG. 5G, after the rinse step, there is executed a residue removing step in which IPA as a residue removing liquid is supplied to a substrate W to remove residues which remains on an upper surface of the substrate W after removal of the particle holding layer 100 (S6). The residue removing step is executed, for example, for 60 seconds.

In the residue removing step, the electric motor 23 changes the rotating speed of the spin base 21 to a predetermined residue removing speed. The residue removing speed is, for example, 300 rpm. Then, the DIW valve 52 is closed. Next, the third nozzle moving unit 33 moves the third movement nozzle 18 to the center position. Then, the IPA valve 54 is opened. Thereby, IPA is supplied from the third movement nozzle 18 to the upper surface of the substrate W in a rotating state. IPA supplied to the upper surface of the substrate W spreads over the entirety of the upper surface of the substrate W due to a centrifugal force to replace DIW on the substrate W. Excess IPA is removed from the substrate W at the radially outer side due to a centrifugal force.

In the residue removing step, the heater raising/lowering unit 65 disposes the heater unit 6 at the proximity position. Thereby, replacement of IPA by DIW is increased in efficiency. In the residue removing step, the second nitrogen gas valve 55B is also opened. Thereby, a gas such as nitrogen gas is discharged radially from the horizontal flow discharge port 72 of the third movement nozzle 18, and an upper surface of a substrate W is covered with the horizontal air flow 82 (upper surface covering step). It is preferable that the discharge of nitrogen gas from the horizontal flow discharge port 72 is started prior to the discharge of IPA from the center discharge port 70. A flow rate of nitrogen gas discharged from the horizontal flow discharge port 72 is, for example, approximately 100 liters/minute. Since the upper surface of the substrate W is covered with the horizontal air flow 82 of nitrogen gas, it is possible to suppress or prevent droplets splashed back from an inner wall of the chamber 4 or mists, etc., in the atmosphere from being adhered to the upper surface of the substrate W.

Figure 5H:
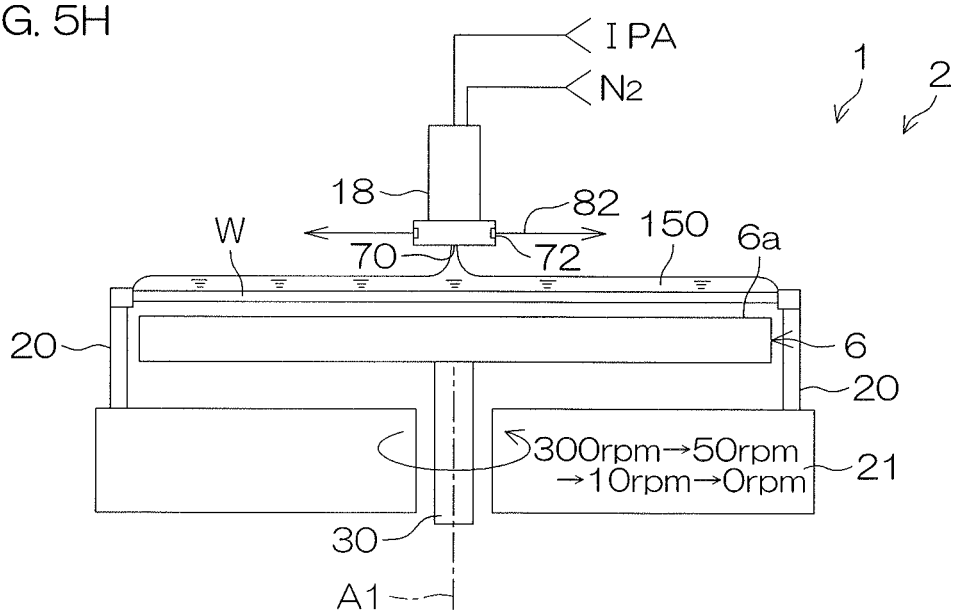

With reference to FIG. 5H, after the residue removing step, there is executed a liquid film forming step in which, as a second processing liquid (low surface-tension liquid) to the upper surface of the substrate W, IPA is continuously supplied to form a liquid film 150 of IPA (S7). The liquid film forming step is executed, for example, for 15.4 seconds.

In detail, rotation of a substrate W is decreased and stopped, and a thick liquid film 150 of IPA as a second processing liquid is formed on the upper surface of the substrate W (second processing liquid paddle step). The rotation of the substrate W is decreased from a residue removing speed in a stepwise manner (speed-decreasing step, gradual speed-decreasing step, stepwise speed-decreasing step). More specifically, the rotating speed of the substrate W is decreased from 300 rpm to 50 rpm and kept for a predetermined time. Thereafter, the rotating speed thereof is decreased to 10 rpm, kept for a predetermined time, thereafter, decreased to 0 rpm (stopped) and kept for a predetermined time.

On the other hand, the third movement nozzle 18 is held on the rotation axis A1 to continuously discharge IPA as a second processing liquid from the center discharge port 70 to the rotation center of the upper surface of the substrate W and also discharge an inert gas from the horizontal flow discharge port 72, thereby forming the horizontal air flow 82. Discharge of IPA from the center discharge port 70 continues over an entire period of the time in the liquid film forming step. That is, even when rotation of the substrate W is stopped, an organic solvent is continuously discharged. As described so far, over an entire period of the time from a decrease in rotation of the substrate W to stop of the rotation, IPA is continuously supplied. Thereby, there is found no place on the upper surface of the substrate W where IPA is lost. Further, even after rotation of the substrate W has been stopped, IPA is continuously supplied, thus making it possible to form a thick liquid film 150 on the upper surface of the substrate W.

The heater unit 6 keeps the same position as that in the residue removing step (S6), for example, it is at the proximity position. Thereby, a substrate W is pre-heated by radiant heat from the facing surface 6a (substrate preheating step). The chuck pin 20 is changed from the closed state to the opened state after rotation of the substrate W has been stopped and while a stoppage state thereof is kept. Thereby, the chuck pin 20 supports from below a lower surface of the substrate W at a peripheral edge portion thereof and is kept apart from a peripheral edge portion on an upper surface of the substrate W. Therefore, the upper surface of the substrate W is opened in its entirety.

Figure 5I:
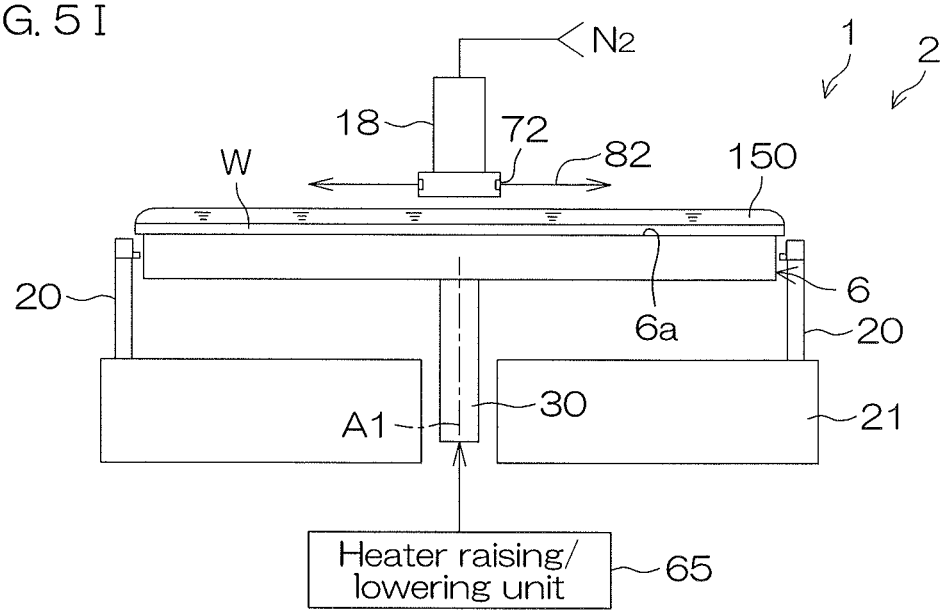

Next, with reference to FIG. 5I, there is executed a gas phase layer forming step in which, in a state that a substrate W is raised by the heater unit 6, that is, in a state that the facing surface 6a is in contact with a lower surface of the substrate W, the substrate W is heated to form a gas phase layer between the liquid film 150 and an upper surface of the substrate W (S9). The gas phase layer forming step is executed, for example, for 20 seconds.

In the gas phase layer forming step, the heater raising/lowering unit 65 raises the heater unit 6 up to the upper position. Thereby, in a state that such a positional relationship is realized that a lower surface of a substrate W is in contact with the facing surface 6a of the heater unit 6, the substrate W is heated by using the heater unit 6 (second heating step). In detail, in the course of raising the heater unit 6 up to the upper position, the substrate W is delivered from the chuck pin 20 to the facing surface 6a and the substrate W is supported by the facing surface 6a (heater unit approaching step, heater unit contact step). Then, the IPA valve 54 is closed, and discharge of IPA from the center discharge port 70 is stopped. Rotation of the spin base 21 is kept in a stoppage state. The third movement nozzle 18 (center discharge port 70) is positioned above the rotation center of the substrate W.

On the liquid film 150 which has been heated from an upper surface of a substrate W, evaporation occurs at an interface with the upper surface of the substrate W. Thereby, a gas phase layer constituted with a gas of IPA is formed between the upper surface of the substrate W and the liquid film 150. Thus, the liquid film 150 is in a state being supported on the gas phase layer in an entire region of the upper surface of the substrate W.

Next, there is executed a liquid film removing step in which the liquid film 150 is moved on the gas phase layer to remove IPA which constitutes the liquid film 150 from the upper surface of the substrate W (S9 and S10). In the liquid film removing step, there are executed a hole making step (refer to FIG. 5J) and a hole expanding step (refer to FIG. 5K).

Figure 5J:
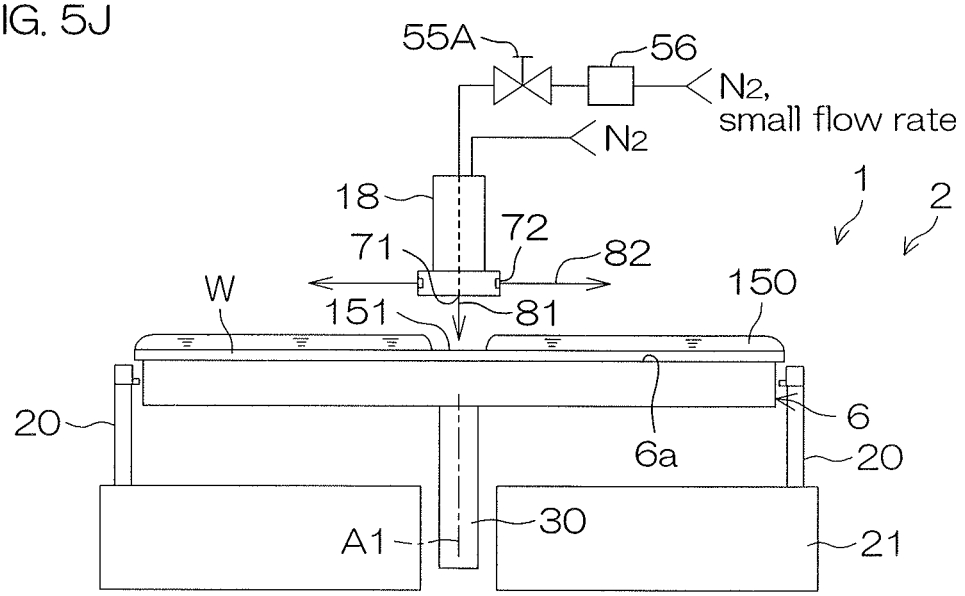

At first, with reference to FIG. 5J, in the liquid film removing step, there is executed the hole making step in which a linear air flow 81 of a gas (for example, nitrogen gas) is sprayed perpendicularly at a small flow rate (first flow rate, for example, 5 liters/minute) onto the center of the substrate W from the linear flow discharge port 71 of the first movement nozzle 15 to make a small hole 151 in the central region of the liquid film 150 (S9). Since the linear air flow 81 is a small flow rate, it is possible to prevent or suppress a liquid from being splashed back on the liquid film 150 when the small hole 151 is made in the liquid film 150. Rotation of the substrate W is stopped and, therefore, the hole making step is executed in the liquid film 150 on the substrate W in a stationary state.

Figure 5K:
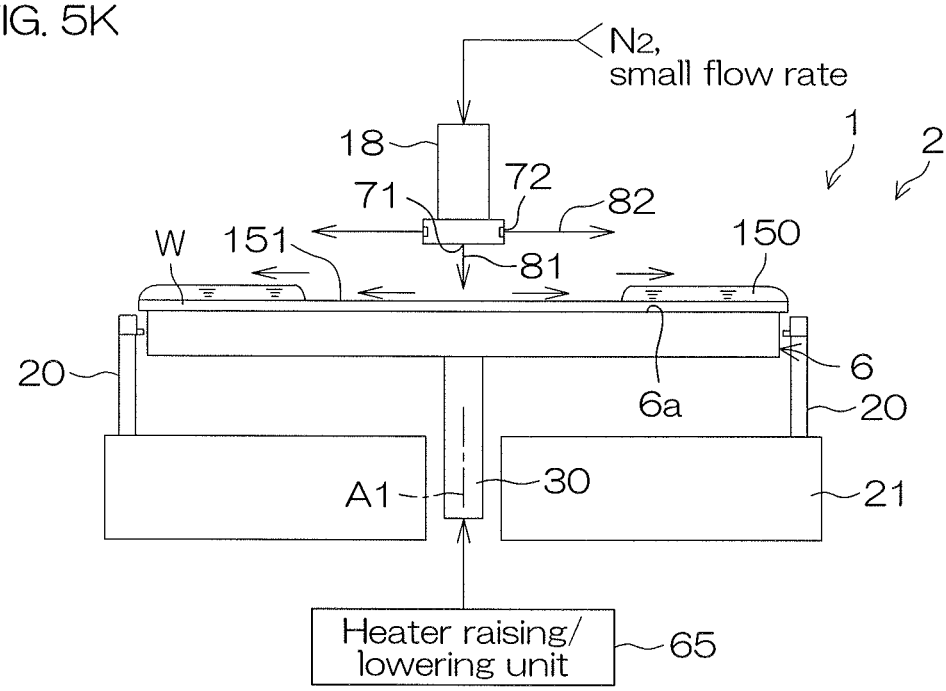

Then, with reference to FIG. 5K, in the liquid film removing step, there is executed the hole expanding step in which the hole 151 is expanded to an outer periphery of the substrate W and the liquid film 150 is moved on the gas phase layer, thereby removing outside a substrate W a second processing liquid which constitutes the liquid film 150 (S10).

Rapid heating of a substrate W is started immediately after the hole is opened on the liquid film 150 (that is, substantially at the same time). Thereby, when the hole is made by nitrogen gas to start movement outside of the liquid film 150, heating of the substrate W is quickly started (substantially at the same time), by which the liquid film 150 is moved outside the substrate W without stoppage.

More specifically, at the central region where the hole is opened and no liquid film 150 is present, a substrate W is rapidly increased in temperature as compared with a peripheral region thereof where the region liquid film 150 is present. Thereby, a large temperature gradient occurs inside the substrate W at a peripheral edge of the hole 151. That is, an inner side of the peripheral edge of the hole 151 is high in temperature and an outer side thereof is low in temperature. Due to the temperature gradient, the liquid film 150 which is supported on a gas phase layer starts to move to a low temperature side, that is, to an external side, by which the hole 151 at the center of the liquid film 150 is expanded.

Thus, the temperature gradient caused by heating of a substrate W can be utilized to remove outside the substrate W the liquid film 150 on the substrate W (heating removing step). More specifically, the liquid film 150 inside a region where a pattern is formed on an upper surface of the substrate W can be removed by movement of IPA by the temperature gradient.

Figure 5L:
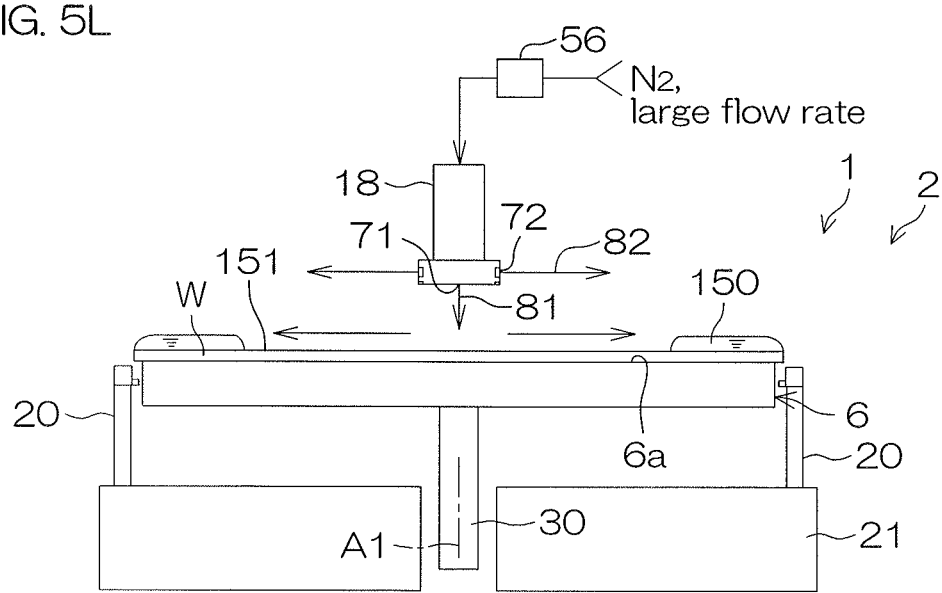

Then, as shown in FIG. 5L, the mass flow controller 56 increases a flow rate of inert gas discharged from the linear flow discharge port 71. Thereby, nitrogen gas is sprayed at a large flow rate (second flow rate, for example, 80 liters/minute) onto a center of a substrate W, and the hole 151 in the center of the liquid film 150 is further expanded (gas removing step, liquid film moving step). In response to an increase in flow rate, a flow speed is also increased. Due to an increase in flow rate of nitrogen gas, the liquid film 150 which has moved to an outer periphery region on an upper surface of the substrate W is pushed further outside the substrate W. Rotation of the substrate W is kept in a stoppage state.

Specifically, during expansion of the hole 151 due to the temperature gradient, nitrogen gas is increased in flow rate, thus making it possible to avoid stoppage of movement of the liquid film 150 and continuously move the liquid film 150 outside the substrate W. If the liquid film 150 is moved only by utilizing the temperature gradient, the liquid film 150 at a peripheral edge region on an upper surface of the substrate W may be stopped. Thus, nitrogen gas is increased in flow rate, thus making it possible to assist movement of the liquid film 150 and thereby remove the liquid film 150 from an entire region of the upper surface of the substrate W.

The second nitrogen gas valve 55B is held in an opened state. Therefore, an upper surface of a substrate W is covered with the horizontal air flow 82 which is formed by nitrogen gas discharged from the horizontal flow discharge port 72. As a result, while suppressing or preventing foreign matter such as droplets and mist from being adhered to the upper surface of the substrate W, the liquid film 150 on the substrate W can be removed.

Figure 5M:
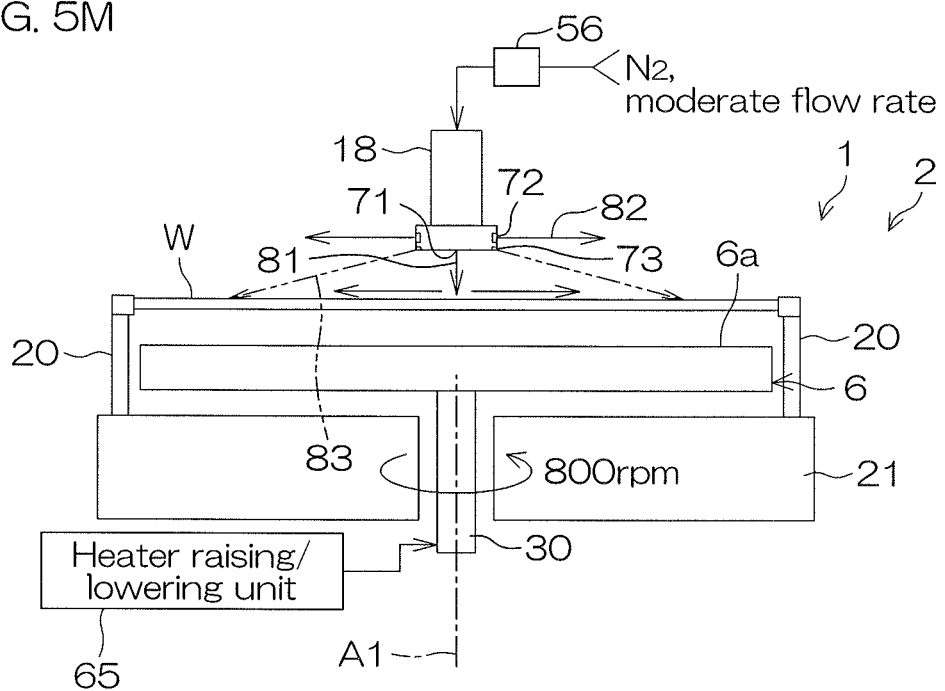

After removal of the liquid film 150, as shown in FIG. 5M, a spin drying step is executed (S11). First, the heater raising/lowering unit 65 disposes the heater unit 6 at a lower position. In this course, a substrate W is supported by the chuck pin 20. When the substrate W is supported by the chuck pin 20, the chuck pin driving unit 25 turns the chuck pin 20 to the closed state and the chuck pin 20 grips the substrate W. Then, the mass flow controller 56 lowers a flow rate of inert gas discharged from the linear flow discharge port 71. Thereby, nitrogen gas is sprayed at a moderate flow rate (for example, 15 liters/minute) onto the center of the substrate W. In this state, the electric motor 23 accelerates rotation of the spin base 21 to a high rotating drying speed (for example, 800 rpm). Thereby, a liquid composition on a front surface of the substrate W can be completely shaken off due to a centrifugal force.

In the spin drying step, the horizontal air flow 82 is continuously formed. Therefore, since an upper surface of a substrate W is covered with an air flow of nitrogen gas, it is possible to prevent droplets scattered around and splashed back or mists in the vicinity from being adhered to the upper surface of the substrate W.

In the spin drying step, as shown by a double dotted & dashed line in FIG. 5M, the third nitrogen gas valve 55C may be opened to discharge nitrogen gas from the inclined flow discharge port 73. An inclined air flow 83 formed by nitrogen gas discharged from the inclined flow discharge port 73 collides with an upper surface of a substrate W to change its direction outside in parallel with the upper surface of the substrate W.

After the spin drying step, rotation of the spin base 21 is stopped and the first nitrogen gas valve 55A, the second nitrogen gas valve 55B and the third nitrogen gas valve 55C are closed to stop discharge of nitrogen gas from the third movement nozzle 18. Then, the third nozzle moving unit 33 retracts the third movement nozzle 18. Further, the chuck pin driving unit 25 turns the chuck pin 20 to the opened state. Thereby, a substrate W is kept placed on the chuck pin 20. Thereafter, there is executed a substrate transfer step in which the transfer robot CR enters the processing unit 2, scoops up a substrate W which has been processed from the spin chuck 5 and carries it out from the processing unit 2 (S12). The substrate W is delivered from the transfer robot CR to the transfer robot IR and housed in the carrier C by the transfer robot IR.

Figure 7A:
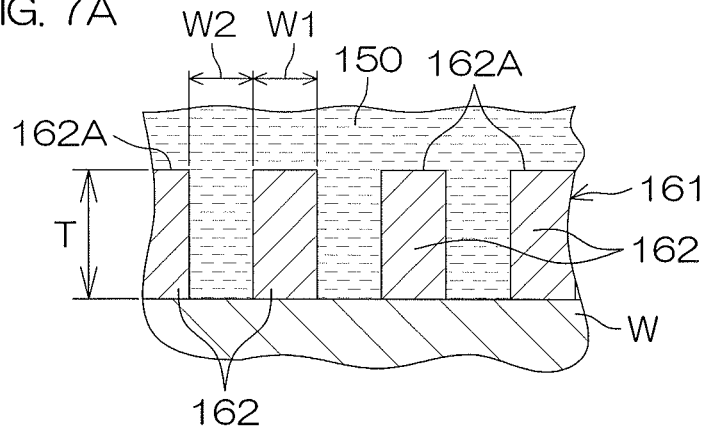
FIG. 7A to FIG. 7C are each a schematic sectional view which shows a periphery of an upper surface of a substrate when a liquid film is removed from the substrate in the drying step.
Figure 7B:
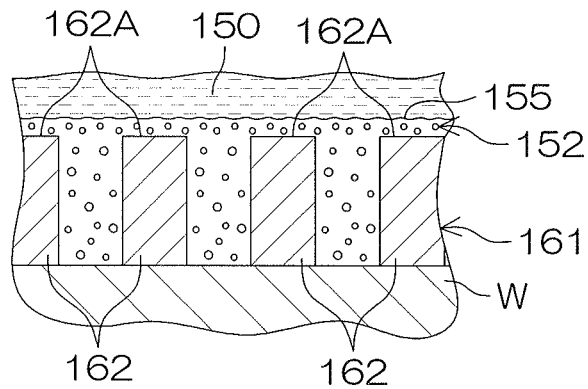

FIG. 7A and FIG. 7B are each an illustrative sectional view for describing formation of a gas phase layer 152 on an upper surface of a substrate W. A fine pattern 161 is formed on the upper surface of the substrate W. The pattern 161 includes a fine protruded structure body 162 which is formed on the upper surface of the substrate W. The structure body 162 may include an insulator film or may include a conductive film. Further, the structure body 162 may be a layered film on which a plurality of films are layered. Where line-shaped structure bodies 162 are adjacent to each other, a groove is formed therebetween. In this case, the structure body 162 may be approximately 10 nm to 45 nm in width W1, and an interval W2 between adjacent structure bodies 162 may be approximately 10 nm to several μm. The structure body 162 may be, for example, approximately 50 nm to 5 μm in height T. Where the structure body 162 is formed in a tubular shape, a hole is formed in the inside thereof.

In the liquid film forming step (S7), as shown in FIG. 7A, the liquid film 150 formed on the upper surface of a substrate W fills the inside of the pattern 161 (a space between adjacent structure bodies 162 or an internal space of a tubular structure body 162).

In the gas phase forming step (S8), in a state that the heater unit 6 is in contact with a substrate W, the substrate W is heated to give a temperature (110° C. to 150° C.) higher than a boiling point of a second processing liquid (in the case of IPA, 82.4° C.). Thereby, the second processing liquid in contact with a front surface of the substrate W will evaporate to generate a gas of the second processing liquid, resulting in formation of a gas phase layer 152 as shown in FIG. 7B. The gas phase layer 152 fills the inside of the pattern 161 and extends outside the pattern 161, thereby forming an interface 155 with the liquid film 150 above from an upper surface 162A of the structure body 162. The liquid film 150 is supported on the interface 155. In this state, since a liquid surface of an organic solvent is not in contact with the pattern 161, there occurs no pattern collapse derived from a surface tension of the liquid film 150.

When a substrate W is heated to cause evaporation of the organic solvent, a liquid phase organic solvent is instantly drained from the inside of the pattern 161. Then, the liquid phase organic solvent is supported on the formed gas phase layer 152 and it is separated from the pattern 161. Thus, the gas phase layer 152 of the organic solvent is interposed between an upper surface of the pattern 161 (an upper surface 162A of the structure body 162) and the liquid film 150 to support the liquid film 150.

Figure 7C:
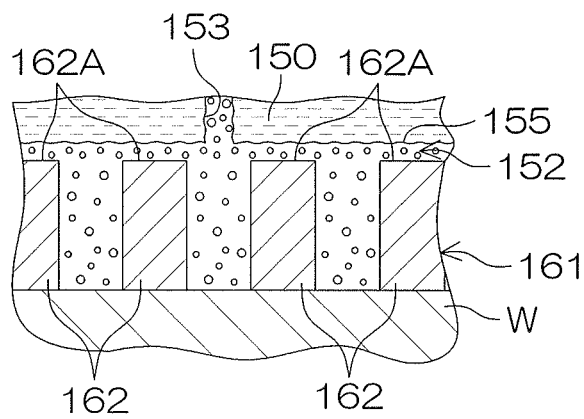

As shown in FIG. 7C, when a crack 153 occurs on the liquid film 150 floating from the upper surface of the substrate W, it causes defects such as watermarks, etc., after drying. Thus, in this preferred embodiment, after rotation of a substrate W has been stopped, supply of an organic solvent is stopped to form the thick liquid film 150 on the substrate W to avoid occurrence of a crack. When the heater unit 6 is brought into contact with the substrate W, rotation of the substrate W is stopped and, therefore, the liquid film 150 will not be divided due to a centrifugal force. Therefore, it is possible to avoid occurrence of a crack on the liquid film 150. Further, the heater unit 6 is adjusted for output and time in contact with a substrate W such that steam of the organic solvent will not break through the liquid film 150 or blow out, by which occurrence of a crack may be avoided. More specifically, the heater unit 6 is kept away from a substrate W to avoid excessive heating of the substrate W, by which occurrence of a crack on the liquid film 150 may be avoided.

In a state that the liquid film 150 is supported on the gas phase layer 152, a frictional resistance acting on the liquid film 150 is negligibly small. Therefore, when a force parallel with an upper surface of a substrate W is applied to the liquid film 150, the liquid film 150 will be moved easily. In this preferred embodiment, a hole is made at the center of the liquid film 150, thereby generating a flow of IPA due to a difference in temperature at an edge portion of the hole 151 to move and remove the liquid film 150 supported on the gas phase layer 152.

In the substrate processing of this preferred embodiment, as shown in FIG. 4, there are executed the first processing liquid supplying step, the holding-layer forming step, the holding-layer removing step, the liquid film forming step, the gas phase layer forming step and the liquid film removing step in this order. In the holding-layer forming step, the first processing liquid is solidified or cured to form the particle holding layer 100 on an upper surface of a substrate W. When the first processing liquid is solidified or cured, the particles 101 are separated from the substrate W. The thus separated particles 101 are held in the particle holding layer 100. Therefore, in the holding-layer removing step, a peeling liquid is supplied to the upper surface of the substrate W, thus making it possible to peel and remove the particle holding layer 100 in a state that the particles 101 are held from the upper surface of the substrate W.

Further, in the liquid film forming step, there is formed the liquid film 150 of IPA (second processing liquid) which covers an upper surface of a substrate W. Then, in the gas phase layer forming step, the substrate W is heated to form a gas phase layer 152 composed of a gas derived from evaporation of the second processing liquid between the liquid film 150 and the upper surface of the substrate W. The liquid film 150 of the second processing liquid is held on the gas phase layer 152. In this state, the liquid film 150 of the second processing liquid is removed, thus making it possible to suppress or prevent collapse of the pattern 161 on the upper surface of the substrate W due to a surface tension of the second processing liquid. The gas phase layer 152 is preferably formed so that an interface with the second processing liquid will be positioned outside the pattern 161 on the upper surface of the substrate W. Thereby, it is possible to avoid application of a surface tension of the second processing liquid to the pattern 161 on the upper surface of the substrate W and to remove outside the substrate W the liquid film 150 of the second processing liquid in a state that no surface tension is applied.

As described so far, it is possible to satisfactorily remove particles from an upper surface of a substrate W and satisfactorily dry the upper surface of the substrate W.

According to this preferred embodiment, the heating step includes a first heating step in which a substrate W is heated by using the heater unit 6 in the holding-layer forming step and a second heating step in which the substrate W is heated by using the heater unit 6 in the gas phase layer forming step. According to the method, the common heater unit 6 can be used in the holding-layer forming step and in the gas phase layer forming step. Therefore, it is not necessary to provide a plurality of units for heating the substrate W.

According to this preferred embodiment, in the heating step, the heater unit 6 is kept constant in temperature. Further, during execution of the heating step, a distance is changed between a lower surface of a substrate W and the facing surface 6a of the heater unit 6 (distance changing step).

Time necessary for changing a temperature of the heater unit 6 is longer than time necessary for changing a temperature of a substrate W. Therefore, where the heater unit 6 is changed in temperature to heat the substrate W in the heating step, it is necessary to wait until the heater unit 6 is changed to a desired temperature in order that the substrate reaches a desired temperature. Therefore, the time necessary for substrate processing may take longer than necessary.

An amount of heat transmitted from the heater unit 6 to a substrate W is changed depending on a distance between a lower surface of the substrate W and the heater unit 6. Thus, in a state that the heater unit 6 is kept constant in temperature, a distance between the lower surface of the substrate W and the heater unit is changed, by which the temperature of the substrate can be changed to a desired temperature. Therefore, it is possible to save time necessary for changing the temperature of the heater unit 6. It is also possible to save time necessary for substrate processing.

The shorter the distance between a lower surface of a substrate W and the heater unit 6, the larger the amount of heat transmitted to the substrate W, and the substrate W is elevated in temperature to a greater extent. For example, in the first heating step, a distance between the lower surface of the substrate W and the heater unit 6 is changed so as to give a positional relationship that the lower surface of the substrate W is separated from the heater unit 6, and in the second heating step, a distance between the lower surface of the substrate W and the heater unit 6 is changed so as to give a positional relationship that the lower surface of the substrate W is in contact with the heater unit 6. Thereby, a temperature of the substrate W in the second heating step will be set higher than a temperature of the substrate W in the first heating step.

According to this preferred embodiment, the solute contained in the first processing liquid is a heat-sensitive water-soluble resin. In the first heating step of the holding-layer forming step, a substrate W is heated such that a temperature of the first processing liquid supplied to the upper surface of the substrate W will be a temperature lower than a quality-changing temperature.

According to the above-described method, in the holding-layer forming step, a substrate W is heated so that a temperature of the first processing liquid will be a temperature lower than a quality-changing temperature, thereby forming the particle holding layer 100. Therefore, although the particle holding layer 100 is hardly soluble or insoluble in a peeling liquid such as SC1 liquid or DIW, it can be peeled by the peeling liquid. Accordingly, in the holding-layer removing step, without dissolving the particle holding layer 100 formed on the upper surface of the substrate W by using the peeling liquid, it is possible to peel and remove the particle holding layer 100 in a state that the particles 101 are held from an upper surface of the substrate W.

As a result, the particle holding layer 100 in a state that the particles 101 are held is peeled from the upper surface of the substrate W, thus making it possible to remove the particles 101 at a high removal ratio. Further, it is possible to suppress residues of the particle holding layer 100 from remaining on the upper surface of the substrate W or adhering again thereto.

According to this preferred embodiment, in the holding-layer forming step, a substrate W is heated so that a temperature of the first processing liquid supplied to an upper surface of the substrate W can be lower than a boiling point of the solvent. Therefore, the solvent is allowed to remain in the particle holding layer 100 after the first heating step of the holding-layer forming step. Therefore, in the subsequent holding-layer removing step, it is possible to easily peel the particle holding layer 100 from the upper surface of the substrate W by interactions between the solvent remaining in the particle holding layer 100 and the supplied peeling liquid. That is, the peeling liquid is allowed to permeate into the particle holding layer 100 and reach an interface with the substrate W, by which the particle holding layer 100 can be floated and peeled from the upper surface of the substrate W.

In this preferred embodiment, the peeling liquid is SC1 liquid or DIW, and the solvent of the first processing liquid is PGEE. Therefore, the peeling liquid is compatible with the solvent. In the holding-layer forming step, when the solvent is appropriately allowed to remain in the particle holding layer 100, the peeling liquid compatible with the solvent can permeate into the particle holding layer 100 to reach an interface with a substrate W. Thereby, it is possible to float and peel the particle holding layer 100 from an upper surface of the substrate W.

According to this preferred embodiment, after the holding-layer removing step and also before the liquid film forming step, a residue removing liquid such as IPA is supplied to an upper surface of a substrate W to remove residues remaining on the upper surface of the substrate W after removal of the particle holding layer 100 (residue removing step). The residue removing liquid has a property that dissolves a solute composition which forms the particle holding layer 100. Therefore, prior to the liquid film forming step, residues of the particle holding layer 100 can be dissolved in the residue removing liquid and removed from the upper surface of the substrate W.

According to this preferred embodiment, the residue removing liquid and the second processing liquid are the same liquid. Therefore, in the liquid film forming step, it is possible to save time for replacing the residue processing liquid by the second processing liquid on an upper surface of a substrate W. It is, therefore, possible to shorten the time necessary for substrate processing.

Further, the third movement nozzle 18 which is a second processing liquid supplying unit also functions as a residue-removing liquid supplying unit. That is, the third movement nozzle 18 which is used in the liquid film forming step can be used in the residue removing step as well. Therefore, it is possible to execute continuously the residue removing step and the subsequent liquid film forming step without changing the unit for supplying a liquid to an upper surface of a substrate W in the residue removing step or in the liquid film forming step.

According to this preferred embodiment, the liquid film removing step includes the hole making step and the hole expanding step. Therefore, in the liquid film removing step, the hole 151 formed at the central region of the liquid film 150 is expanded to an outer periphery, thereby removing a liquid film from a substrate W. Therefore, it is possible to suppress or prevent droplets of the second processing liquid from remaining on the substrate W. It is, therefore, possible to satisfactorily dry an upper surface of the substrate.

The present invention shall not be limited to the embodiments described above but can be carried out in still other modes.

For example, in order to give a temperature for heating a substrate W in the first heating step to a temperature according to the thickness (film thickness) of the particle holding layer 100 expected to be formed in the holding-layer forming step, in the distance changing step, there may be changed a distance between a lower surface of the substrate W and the facing surface 6a of the heater unit 6 in the first heating step.

The film thickness of the particle holding layer 100 is set according to a type (height) of a pattern formed on an upper surface of a substrate W. The particle holding layer 100 can be adjusted for film thickness thereof by changing a substrate rotating speed in the processing liquid supplying step to change thickness of the first processing liquid on the substrate W. In detail, the thickness of the first processing liquid on the substrate W is made thinner with an increase in substrate rotating speed. Therefore, the film thickness of the particle holding layer 100 is also made thinner with an increase in substrate rotating speed.

Further, in the first heating step, the first processing liquid on a substrate W is heated to volatilize a solvent, thereby forming the particle holding layer 100. The solvent is volatilized and the particle holding layer 100 undergoes shrinking. Therefore, the film thickness of the particle holding layer 100 is made thinner than the thickness of the first processing liquid on the substrate W immediately before the start of the first heating step. A ratio of the thickness of the particle holding layer 100 after the first heating step in relation to the thickness of liquid film of the first processing liquid on the substrate W at the start of the first heating step is referred to as a shrinkage ratio of the particle holding layer 100.

When the first processing liquid on an upper surface of a substrate W is made thin due to rotation of the substrate W, there may be a case that the particle holding layer 100 is formed on the substrate W before the start of the first heating step. In this case, the shrinkage ratio is a ratio of the thickness of the particle holding layer 100 after the first heating step in relation to the thickness of the particle holding layer 100 on the substrate W at the start of the first heating step.

The shrinkage ratio of the particle holding layer 100 influences an effect of removing particles. In particular, the larger the shrinkage ratio, the more favorable effect of removing particles tends to be obtained. In order to obtain a favorable effect of removing particles, it is necessary that the particle holding layer 100 is allowed to shrink at a desired shrinkage ratio. A relationship between a heating temperature and a shrinkage ratio is varied depending on the degree of the film thickness. Therefore, the heating temperature necessary for allowing the particle holding layer 100 to shrink at a desired shrinkage ratio is varied depending on the film thickness.

Thus, a distance between a lower surface of a substrate W and the facing surface 6a of the heater unit 6 in the first heating step may be set in advance so that the substrate W will be heated to a temperature depending on the film thickness of the particle holding layer 100 which is expected to be formed in the holding-layer forming step (distance setting step). In the distance changing step, a distance between the lower surface of the substrate W and the facing surface 6a of the heater unit 6 in the first heating step is changed to a distance which is set in advance in the distance setting step, by which the particle holding layer 100 formed by volatilization of a solvent is heated at a predetermined heating temperature. Thereby, the particle holding layer 100 is allowed to shrink at a desired shrinkage ratio and particles can be satisfactorily removed from the substrate W.

For example, where a substrate W is rotated in the first processing liquid supplying step at a rotating speed in which the thickness of the particle holding layer 100 formed on the substrate W gives a first layer thickness (for example, 30 nm), the position of the heater unit 6 in the first heating step is set at a proximity position, as with the present preferred embodiment. Where the substrate W is rotated in the first processing liquid supplying step at a rotating speed in which the thickness of the particle holding layer 100 formed on the substrate W gives a second layer thickness (for example, 75 nm), the position of the heater unit 6 in the first heating step is set at a lower position, unlike the present preferred embodiment.

Where the temperature of the heater unit 6 is 195° C., a substrate W is heated up to 90° C. by the heater unit 6 positioned at the lower position. Where the temperature of the heater unit 6 is 195° C., the substrate W is heated to 110° C. by the heater unit 6 positioned at the proximity position. A quality-changing temperature of a heat-sensitive water-soluble resin used as a solute of the first processing liquid is 200° C. and a boiling point of PGEE which is used as a solvent of the first processing liquid is 132° C. Therefore, where the temperature of the heater unit 6 is 195° C. and if the first heating position is set at a lower position, at a proximity position and at any given position between them, the substrate W can be heated such that a temperature of the first processing liquid on the substrate W will be lower than the boiling point of the solvent and also a temperature of the first processing liquid on the substrate W will be lower than the quality-changing temperature of the heat-sensitive water-soluble resin in the first heating step.

Further, in the above-described mode, while the heater unit 6 is kept constant at a temperature of 195° C., etc., the first heating position is changed whenever necessary, thus making it possible to change a heating temperature of a substrate W. Where the temperature of the heater unit 6 itself is changed, a temperature in the middle of the change will suffer an overshoot in which the temperature becomes higher than a set temperature. Therefore, time necessary for bringing a temperature of the heater unit 6 to a set temperature and keeping the temperature stable may be prolonged. Consequently, the heater unit 6 is kept constant in temperature, thus making it possible to shorten the time necessary for changing the temperature of the heater unit 6 and perform heat processing more stably.

Further, in the above-described preferred embodiment, a heat-sensitive water-soluble resin is used as a solute of the first processing liquid. However, a resin which is used as the solute of the first processing liquid may be a resin other than the heat-sensitive water-soluble resin.

Resins other than the heat-sensitive water-soluble resin which can be used as a solute contained in the first processing liquid include, for example, acrylic resin, phenol resin, epoxy resin, melamine resin, urea resin, unsaturated polyester resin, alkyd resin, polyurethane, polyimide, polyethylene, polypropylene, polyvinyl chloride, polystyrene, polyvinyl acetate, polytetrafluoroethylene, acrylonitrile butadiene styrene resin, acrylonitrile styrene resin, polyamide, polyacetal, polycarbonate, polyvinyl alcohol, modified polyphenylene ether, polybutylene terephthalate, polyethylene terephthalate, polyphenylene sulfide, polysulfone, polyether ether ketone, and polyamide imide. Where these resins are used in the first processing liquid, there can be used any given solvent capable of dissolving a resin used as a solute.

A resin other than a heat-sensitive water-soluble resin as a solute of the first processing liquid is free of a quality-changing temperature. Therefore, in the first heating step of the particle holding layer forming step, unlike in a case where as a solute of the first processing liquid, the heat-sensitive water-soluble resin is used, it is not necessary that the temperature of the first processing liquid is lower than a quality-changing temperature of the heat-sensitive water-soluble resin. And, a substrate W may be heated such that the temperature of the first processing liquid on the substrate W will be lower than a boiling point of the solvent.

Where a resin other than the heat-sensitive water-soluble resin is used as a solute of the first processing liquid, any given liquid having a property that dissolves any of resins may be used as the residue removing liquid. Where a resin other than the heat-sensitive water-soluble resin is used as a solute of the first processing liquid, as the residue removing liquid, for example, organic solvents such as thinner, toluene, acetates, alcohols, glycols as well as acidic liquids such as acetic acid, formic acid, and hydroxyacetic acid can be used.

As the solute of the first processing liquid, for example, organic compounds other than a resin and other mixtures with an organic compound may be used, in addition to the above-described various types of resins. Alternatively, the solute may be a compound other than an organic compound.

As the peeling liquid, a peeling liquid other than a water-based one can be used. In this case, a solute which forms the particle holding layer 100 that is hardly soluble or insoluble in the peeling liquid, a solvent which is compatible with the peeling liquid and has a property dissolving the solute, and a residue removing liquid which is compatible with the peeling liquid and has a property dissolving the solute may be combined appropriately.

Further, in the above-described preferred embodiment, the second processing liquid is a low surface-tension liquid lower in surface tension than water. However, the second processing liquid shall not be limited to a low surface-tension liquid but may be DIW.

Further, in the above-described preferred embodiment, IPA which is discharged from the third movement nozzle 18 is used as the second processing liquid and the residue processing liquid. That is, in the above-described preferred embodiment, a liquid which is used as the second processing liquid and a liquid which is used as the residue processing liquid are the same liquid. However, even if a liquid which is used as the second processing liquid and a liquid which is used as the residue processing liquid are not the same liquid as long as they are liquids of the same type, it is possible to shorten the time necessary for performing the residue removing step and the liquid film forming step. Liquids of the same type are referred to as a plurality of liquids in which molecules mainly constituting liquids are similar to each other. That is, liquids of the same type are IPA, etc., which are mutually different in purity.

In the above-described preferred embodiment, the heater unit 6 is raised and lowered in relation to the spin chuck 5 which holds a substrate W, thereby changing a distance between a lower surface of the substrate W and the facing surface 6a of the heater unit 6. Unlike the above-described preferred embodiment, there may be such a configuration that the spin chuck 5 is raised and lowered in relation to the heater unit 6, thereby changing a distance between the lower surface of the substrate W and the facing surface 6a of the heater unit 6. Alternatively, there may be such a configuration that the heater unit 6 and the spin chuck 5 are relatively moved up and down, thereby changing a distance between the lower surface of the substrate W and the facing surface 6a of the heater unit 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
   a substrate holding step of holding a substrate horizontally;
   a first processing liquid supplying step of supplying a first processing liquid that contains a solute and a volatile solvent to an upper surface of the substrate;
   a holding-layer forming step in which the substrate is heated to volatilize at least partially the volatile solvent from the first processing liquid supplied to the upper surface of the substrate and, thereby, the first processing liquid is solidified or hardened to form a particle holding layer on the upper surface of the substrate;
   a holding-layer removing step in which a peeling liquid which peels the particle holding layer is supplied to the upper surface of the substrate, thereby peeling and removing the particle holding layer from the upper surface of the substrate;
   a liquid film forming step in which, after removal of the particle holding layer from the substrate, a second processing liquid is supplied to the upper surface of the substrate, thereby forming a liquid film of the second processing liquid which covers the upper surface of the substrate;
   a gas phase layer forming step in which the substrate is heated to evaporate second processing liquid in contact with the upper surface of the substrate, thereby forming a gas phase layer which holds the liquid film and is located between the upper surface of the substrate and the liquid film;
   a liquid film removing step in which the liquid film is moved on the gas phase layer to remove the second processing liquid which constitutes the liquid film from the upper surface of the substrate,
   a heating step of heating the substrate by using a heater unit facing the lower surface of the substrate, wherein the heating step includes a first heating step of using the heater unit to heat the substrate during the holding-layer forming step and a second heating step of using the heater unit to heat the substrate during the gas phase layer forming step, and
   a distance changing step in which a distance between the lower surface of the substrate and the heater unit is changed during execution of the heating step.

2. The substrate processing method according to claim 1, wherein the heater unit heats the substrate so as to at least partially volatilize the volatile solvent in the holding layer forming step, and wherein the heater unit heats the substrate so as to form the gas phase layer in the gas phase layer forming step.

3. The substrate processing method according to claim 1, wherein the heater unit is constant in temperature in the heating step.

4. The substrate processing method according to claim 1, wherein the distance changing step further includes a step in which a distance between the lower surface of the substrate and the heater unit is changed so as to give a positional relationship wherein the lower surface of the substrate is separated from the heater unit in the first heating step and a step in which a distance between the lower surface of the substrate and the heater unit is changed so as to give a positional relationship wherein the lower surface of the substrate is in contact with the heater unit in the second heating step.

5. The substrate processing method according to claim 1, wherein the distance changing step further includes a step in which a distance between the lower surface of the substrate and the heater unit is changed in the first heating step depending on the thickness of the particle holding layer which is formed in the holding-layer forming step.

6. The substrate processing method according to claim 1, wherein a solute composition which is the solute contained in the first processing liquid is insoluble in the peeling liquid before being heated at a temperature equal to or higher than a quality-changing temperature and is also changed in quality by being heated at a temperature equal to or higher than the quality-changing temperature and becomes soluble in the peeling liquid, and
   in the holding-layer forming step, the substrate is heated such that a temperature of the first processing liquid supplied to the upper surface of the substrate becomes a temperature lower than the quality-changing temperature.

7. The substrate processing method according to claim 1, wherein in the holding-layer forming step, the substrate is heated such that a temperature of the first processing liquid supplied to the upper surface of the substrate becomes lower than a boiling point of the volatile solvent.

8. The substrate processing method according to claim 1, wherein the peeling liquid miscible with the volatile solvent.

9. The substrate processing method according to claim 1, further comprising: a residue removing step in which, after the holding-layer removing step and also before the liquid film forming step, a residue removing liquid is supplied to the upper surface of the substrate, thereby removing residues remaining on the upper surface of the substrate after removal of the particle holding layer.

10. The substrate processing method according to claim 9, wherein the residue removing liquid is identical or miscible with the second processing liquid.

11. The substrate processing method according to claim 1, wherein the liquid film removing step includes a hole making step in which, after formation of the gas phase layer, a gas is sprayed onto the liquid film on the substrate to remove partially the second processing liquid, thereby making a hole in the liquid film at a central region of the liquid film and a hole expanding step in which the hole is expanded to an outer periphery of the substrate and the liquid film is moved on the gas phase layer, thereby removing the second processing liquid which constitutes the liquid film outside the substrate.

12. A substrate processing apparatus comprising:
   a substrate holding unit which holds a substrate horizontally;
   a first processing liquid supplying unit; connected to a supply of a first processing liquid that contains a solute and a volatile solvent, wherein the first processing liquid supplying unit is configured to supply the first processing to an upper surface of the substrate, and wherein the first processing liquid is solidified or hardened by volatilizing at least partially the volatile solvent to form a particle holding layer on the upper surface of the substrate;
   a heater unit which faces a lower surface of the substrate and heats the substrate;
   a heater raising/lowering unit which relatively raises and lowers the heater unit in relation to the substrate holding unit in order to change a distance between the lower surface of the substrate and the heater unit;
   a peeling liquid supplying unit connected to a supply of a peeling liquid and configured to supply the peeling liquid to the upper surface of the substrate such that the particle holding layer is peeled by the peeling liquid;

a second processing liquid supplying unit connected to a supply of a second processing liquid and configured to supply the second processing liquid to the upper surface of the substrate;

a controller which controls the first processing liquid supplying unit, the heater unit, the heater raising/lowering unit, the peeling liquid supplying unit, and the second processing liquid supplying unit, wherein the controller is programmed so as to execute a first processing liquid supplying step of supplying the first processing liquid from the first processing liquid supplying unit to the upper surface of the substrate which is held horizontally, a holding-layer forming step in which the substrate is heated by the heater unit to volatilize at least partially the volatile solvent from the first processing liquid supplied to the upper surface of the substrate, by which the first processing liquid is solidified or hardened to form the particle holding layer on the upper surface of the substrate, a holding-layer removing step in which the peeling liquid is supplied from the peeling liquid supplying unit to the upper surface of the substrate, thereby peeling and removing the particle holding layer from the upper surface of the substrate, a liquid film forming step in which, after removal of the particle holding layer from the substrate, the second processing liquid is supplied from the second processing liquid suppling unit to the upper surface of the substrate, thereby forming a liquid film of the second processing liquid which covers the upper surface of the substrate, a gas phase layer forming step in which the substrate is heated by using the heater unit to evaporate second processing liquid in contact with the upper surface of the substrate, thereby forming a gas phase layer which holds the liquid film and is located between the upper surface of the substrate and the liquid film, and a liquid film removing step in which the liquid film is moved on the gas phase layer, thereby removing the second processing liquid which constitutes the liquid film from the upper surface of the substrate, wherein the controller is programmed so as to execute a heating step which heats the substrate using the heater unit, wherein the heating step includes a first heating step of using the heater unit to heat the substrate during the holding-layer forming step and a second heating step of using the heater unit to heat the substrate during the gas phase layer forming step, and wherein the controller is programmed so as to execute a distance changing step wherein the heater raising/lowering unit is controlled during the heating step to change a distance between the lower surface of the substrate and the heater unit.

13. The substrate processing apparatus according to claim 12, wherein the heater unit heats the substrate so as to at least partially volatilize the volatile solvent during the holding layer forming step, and wherein the heater unit heats the substrate so to form the gas phase layer in the gas phase layer forming step.

14. The substrate processing apparatus according to claim 12, wherein the controller is programmed to control the heater unit such that the heater unit is constant in temperature in the heating step.

15. The substrate processing apparatus according to claim 12, wherein:

the distance changing step includes a step in which a distance between the lower surface of the substrate and the heater unit is changed so as to give a positional relationship wherein the lower surface of the substrate is separated from the heater unit in the first heating step and a step in which a distance between the lower surface of the substrate and the heater unit is changed so as to give a positional relationship wherein the lower surface of the substrate is in contact with the heater unit in the second heating step.

16. The substrate processing apparatus according to claim 12, wherein the controller is programmed so as to execute, in the distance changing step, a step in which a distance between the lower surface of the substrate and the heater unit is changed in the first heating step, depending on the thickness of the particle holding layer formed in the holding-layer forming step.

17. The substrate processing apparatus according to claim 12, wherein a solute composition which is the solute contained in the first processing liquid is insoluble in the peeling liquid before being heated at a temperature equal to or higher than a quality-changing temperature and is also changed in quality by being heated at a temperature equal to or higher than the quality-changing temperature and becomes soluble in the peeling liquid, and the controller is programmed so as to heat the substrate by using the heater unit such that, in the holding-layer forming step, a temperature of the first processing liquid supplied to the upper surface of the substrate becomes a temperature lower than the quality-changing temperature.

18. The substrate processing apparatus according to claim 12, wherein the controller is programmed so as to heat the substrate using the heater unit such that, in the holding-layer forming step, a temperature of the first processing liquid supplied to the upper surface of the substrate becomes lower than a boiling point of the volatile solvent.

19. The substrate processing apparatus according to claim 12, wherein the peeling liquid is compatible miscible with the volatile solvent.

20. The substrate processing apparatus according to claim 12, further comprising: a residue-removing liquid supplying unit which supplies to the upper surface of the substrate a residue removing liquid, wherein the controller is programmed so as to execute a residue removing step in which, after the holding-layer removing step and also before the liquid film forming step, the residue removing liquid is supplied from the residue-removing liquid supplying unit to the upper surface of the substrate, thereby removing residues remaining on the upper surface of the substrate after removal of the particle holding layer.

21. The substrate processing apparatus according to claim 20, wherein the second processing liquid supplying unit functions as the residue-removing liquid supplying unit.

22. The substrate processing apparatus according to claim 12, further comprising: a gas supplying unit which supplies a gas to the upper surface of the substrate, wherein the controller is programmed so as to execute, in the liquid film removing step, a hole making step in which, after formation of the gas phase layer, a gas is sprayed from the gas supplying unit onto the substrate to partially remove the second processing liquid of the liquid film on the substrate, thereby making a hole in the liquid film and a hole expanding step in which the hole is expanded to an outer periphery of the substrate and the liquid film is moved on the gas phase layer, thereby removing the second processing liquid which constitutes the liquid film outside the substrate.

* * * * *